(12) United States Patent
Mizuoka et al.

(10) Patent No.: US 10,661,401 B2
(45) Date of Patent: May 26, 2020

(54) COMPONENT MOUNTED BODY MANUFACTURING SYSTEM AND COMPONENT MOUNTED BODY MANUFACTURING METHOD

(71) Applicant: Panasonic Intellectual Property Management Co., Ltd., Osaka (JP)

(72) Inventors: Seiji Mizuoka, Fukuoka (JP); Takahiro Endo, Yamanashi (JP); Yasuhiro Suzuki, Yamanashi (JP); Yoichi Makino, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 164 days.

(21) Appl. No.: 15/888,187

(22) Filed: Feb. 5, 2018

(65) Prior Publication Data

US 2018/0243869 A1    Aug. 30, 2018

(30) Foreign Application Priority Data

Feb. 24, 2017  (JP) .................................. 2017-033076
Feb. 24, 2017  (JP) .................................. 2017-033077

(51) Int. Cl.
*B23Q 3/06* (2006.01)
*B23P 19/04* (2006.01)
(Continued)

(52) U.S. Cl.
CPC .............. *B23Q 3/061* (2013.01); *B23P 19/04* (2013.01); *B23P 21/00* (2013.01);
(Continued)

(58) Field of Classification Search
CPC ........... Y10T 29/5337; Y10T 29/53174; Y10T 29/53178; Y10T 29/53187;
(Continued)

(56) References Cited

U.S. PATENT DOCUMENTS

| 6,519,837 B1* | 2/2003 | Ichikawa .............. B23P 21/004 29/720 |
| 2001/0054223 A1* | 12/2001 | Yamanashi .............. B23Q 1/66 29/563 |

(Continued)

FOREIGN PATENT DOCUMENTS

JP           5779342 B2    9/2015

*Primary Examiner* — Jason L Vaughan
(74) *Attorney, Agent, or Firm* — Pearne & Gordon LLP

(57) ABSTRACT

When a workpiece holder holding a workpiece is rocked around a lateral rocking axis by a work stage of a mounter and the workpiece is positioned so that one mounting surface of the workpiece faces a predetermined direction to be worked, a component is mounted on the one mounting surface by a mounting head of the mounter. When a posture of the workpiece in the workpiece holder is changed by a posture changing head of a posture changer and thereafter the workpiece holder in which the posture of the workpiece is changed is rocked around the lateral rocking axis by the work stage of the mounter and the workpiece is positioned so that the other mounting surface of the workpiece faces a predetermined direction to be worked, a component is mounted on the other mounting surface by the mounting head of the mounter.

20 Claims, 21 Drawing Sheets

(51) Int. Cl.
*B23P 21/00* (2006.01)
*H05K 13/04* (2006.01)
*H05K 13/00* (2006.01)

(52) U.S. Cl.
CPC ..... *H05K 13/0015* (2013.01); *H05K 13/0061* (2013.01); *H05K 13/0404* (2013.01); *H05K 13/0408* (2013.01); *Y10T 29/53174* (2015.01); *Y10T 29/53187* (2015.01); *Y10T 29/53435* (2015.01); *Y10T 29/53539* (2015.01)

(58) Field of Classification Search
CPC ......... Y10T 29/53539; Y10T 29/49901; Y10T 29/49902; H05K 13/04; H05K 13/0452; H05K 13/0015
USPC ........................................................ 269/58
See application file for complete search history.

(56) References Cited

U.S. PATENT DOCUMENTS

| | | | | |
|---|---|---|---|---|
| 2004/0056400 | A1* | 3/2004 | Ghuman | B23P 21/004 269/71 |
| 2007/0169331 | A1* | 7/2007 | Yoshida | B23P 19/001 29/464 |
| 2008/0188363 | A1* | 8/2008 | Baumbusch | B23Q 7/1415 483/15 |
| 2011/0000082 | A1* | 1/2011 | Yamashita | B23Q 7/04 29/791 |

\* cited by examiner

FIG. 17A
FIG. 17B
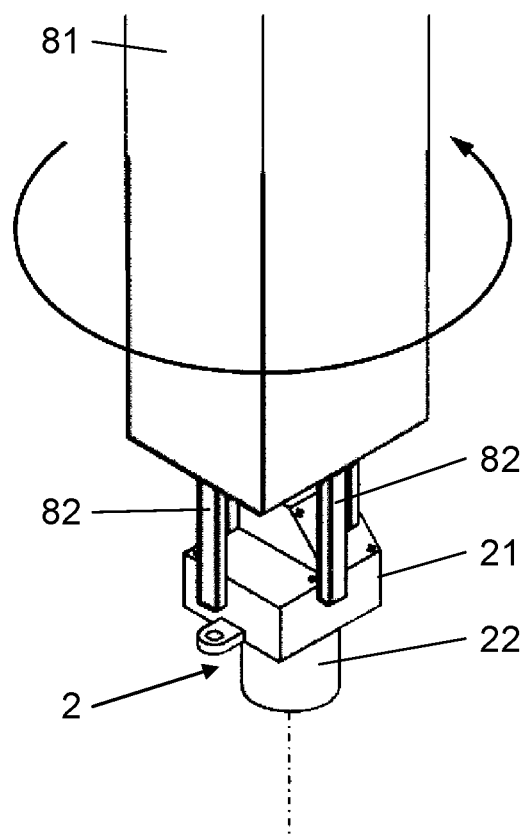
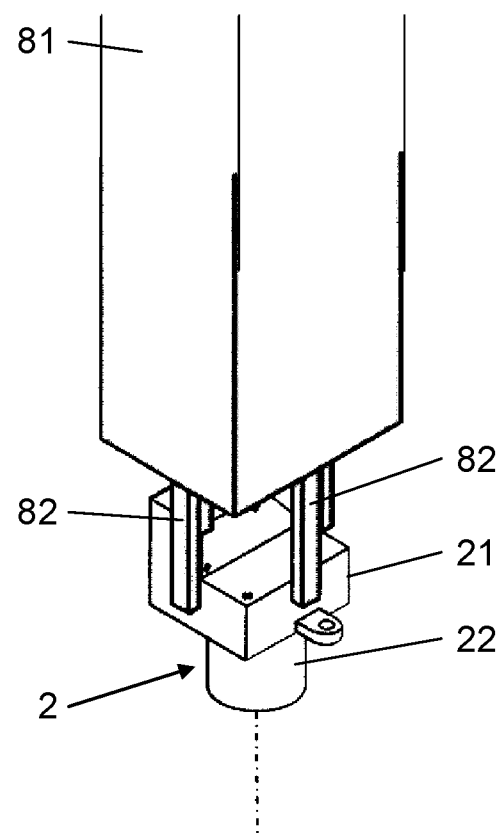

COMPONENT MOUNTED BODY MANUFACTURING SYSTEM AND COMPONENT MOUNTED BODY MANUFACTURING METHOD

BACKGROUND

1. Technical Field

The present disclosure relates to a component mounted body manufacturing system and a component mounted body manufacturing method for manufacturing a component mounted body on which a component is mounted on a workpiece having a three-dimensional shape.

2. Description of the Related Art

In the related art, there is known a component mounted body manufacturing system for three-dimensionally mounting a component on a workpiece having a three-dimensional shape to manufacture a component mounted body having a three-dimensional shape (for example, Japanese Patent No. 5779342). In such a component mounted body manufacturing system, a posture of the workpiece is freely changed by a posture adjustment mechanism so that a mounting surface of the workpiece faces in a predetermined work direction (normally upward), and the component is mounted on the mounting surface.

SUMMARY

A component mounted body manufacturing system of the disclosure includes a first positioning mechanism that rocks a workpiece holder holding a workpiece around a lateral rocking axis, and positions the workpiece so that one mounting surface of the workpiece faces a predetermined direction to be worked, a first working head that performs a predetermined work on the one mounting surface of the workpiece positioned by the first positioning mechanism, a posture change mechanism that changes a posture of the workpiece in which the predetermined work is performed on the one mounting surface, in the workpiece holder, a second positioning mechanism that rocks, around the lateral rocking axis, the workpiece holder in which the posture of the workpiece is changed by the posture change mechanism, and positions the workpiece so that the other mounting surface of the workpiece faces the predetermined direction to be worked, a second working head that performs a predetermined work on the other mounting surface of the workpiece positioned by the second positioning mechanism, and a transport mechanism that transports the workpiece holder from the first positioning mechanism to the second positioning mechanism.

A component mounted body manufacturing system of the disclosure includes a positioning mechanism that rocks, around a lateral rocking axis, a workpiece holder holding the workpiece, and positions the workpiece so that a mounting surface of the workpiece faces a predetermined direction to be worked, a posture change mechanism that changes a posture of the workpiece in the workpiece holder, and a working head that performs a predetermined work on a mounting surface positioned by the positioning mechanism to face the direction to be worked.

A component mounting body manufacturing method of the disclosure includes a first positioning step of positioning the workpiece so that one mounting surface of the workpiece faces a predetermined direction to be worked by rocking, around a lateral rocking axis, a workpiece holder holding the workpiece, a first work step of performing a predetermined work on the one mounting surface of the workpiece positioned in the first positioning step, a posture change step of changing a posture of the workpiece on which the first work step is finished, in the workpiece holder, a second positioning step of positioning the workpiece so that the other mounting surface of the workpiece faces the predetermined direction to be worked by rocking, around the lateral rocking axis, the workpiece holder in which the posture of the workpiece is changed in the posture change step, and a second work step of performing a predetermined work on the other mounting surface of the workpiece positioned in the second positioning step.

According to the disclosure, it is possible to mount a component on a workpiece having a three-dimensional shape with a simple configuration.

BRIEF DESCRIPTION OF THE DRAWINGS

FIG. 17A is a view illustrating a procedure of changing a posture of the workpiece by a posture changing head provided in the component mounted body manufacturing system according to the first exemplary embodiment of the disclosure;

FIG. 17B is a view illustrating a procedure of changing a posture of the workpiece by a posture changing head provided in the component mounted body manufacturing system according to the first exemplary embodiment of the disclosure;

DETAILED DESCRIPTIONS

Prior to describing the exemplary embodiments, problems in the related art will be briefly described.

In the component mounted body manufacturing system in the related art, a posture of a workpiece is adjusted using one posture adjustment mechanism having multiple degrees of freedom and components are mounted on a plurality of the mounting surfaces, which has a problem of complicated configuration.

Accordingly, an object of the disclosure is to provide a component mounted body manufacturing system and a component mounted body manufacturing method capable of manufacturing a component mounted body for mounting a component on a workpiece having a three-dimensional shape with a simple configuration.

First Exemplary Embodiment

Figure 1:
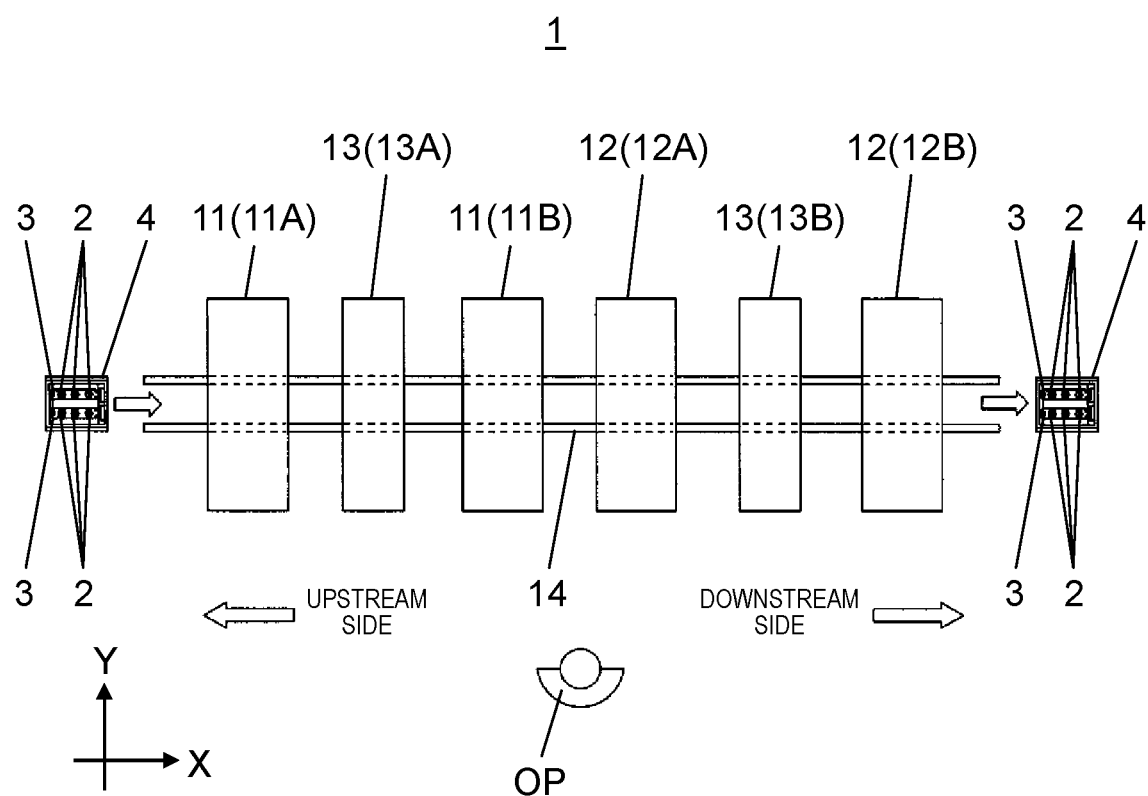
FIG. 1 is a plan view illustrating a schematic configuration of a component mounted body manufacturing system in a first exemplary embodiment of the disclosure.
Figure 2:
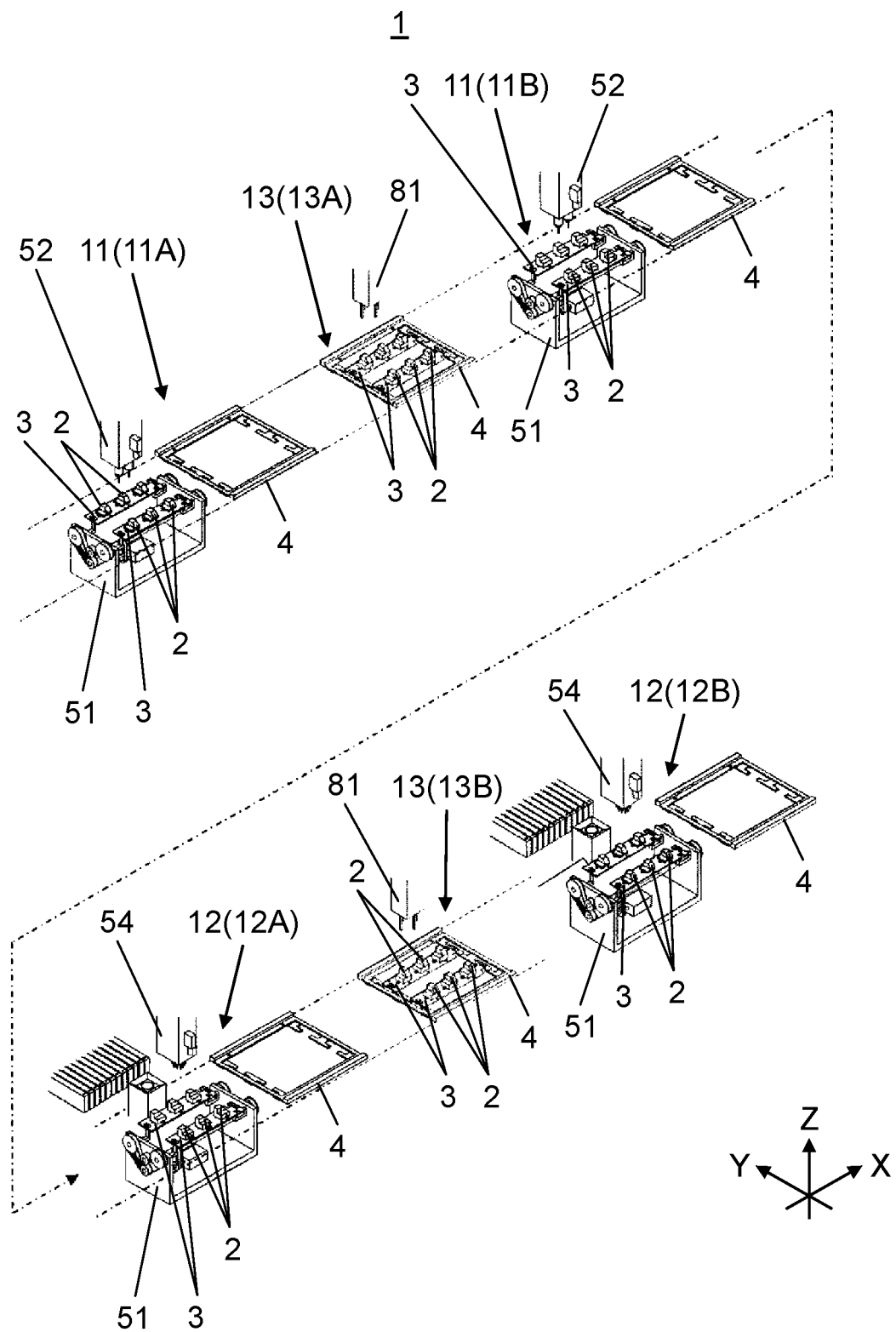
FIG. 2 is a perspective view illustrating the schematic configuration of the component mounted body manufacturing system in the first exemplary embodiment of the disclosure.

FIGS. 1 and 2 illustrate a component mounted body manufacturing system in a first exemplary embodiment of the disclosure. Component mounted body manufacturing system 1 is a system for manufacturing component mounted body manufacturing body 2A having a three-dimensional shape illustrated in FIG. 3B by three-dimensionally mounting a plurality of components PT (FIG. 3B) on workpiece 2 having a three-dimensional shape illustrated in FIG. 3A. For convenience of description, the lateral direction of component mounted body manufacturing system 1 viewed from operator OP is defined as the X axis direction, and the front-rear direction is defined as the Y axis direction. In addition, the vertical direction is defined as the Z axis direction.

In FIG. 1, component mounted body manufacturing system 1 uses the X axis direction as the work flow direction. Workpiece holder 3 (FIG. 4) holding workpiece 2 is used in component mounted body manufacturing system 1. Workpiece holder 3 is placed on carrier 4 (FIG. 6) in a state of holding workpiece 2 (FIG. 5A and FIG. 5B) and. While carrier 4 is transported from an upstream side to a downstream side of component mounted body manufacturing system 1, workpiece 2 held in workpiece holder 3 is applied with a viscous body such as solder or adhesive, and component PT (FIG. 3B) are mounted. Here, workpiece 2 held in workpiece holder 3 is described as plural, but the number of workpieces 2 is not necessarily plural. In addition, workpiece holder 3 placed on carrier 4 is described as plural, but the number of workpiece holders 3 is not necessarily plural.

In FIGS. 1 and 2, component mounted body manufacturing system 1 is provided with two applicators 11 (applicator 11A and applicator 11B) and two mounters 12 (mounter 12A and mounter 12B) in order from the upstream side. Each posture changer 13 (posture changer 13A on the upstream side and posture changer 13B on the downstream side) is provided between two applicators 11 and between two mounters 12. Each device is connected by transport path 14 including a combination of a plurality of the conveyors and the like. Each device is provided with a transport mechanism such as a conveyor and a transfer robot, and component mounted body manufacturing system 1 has the transport mechanism configured to include the transport mechanism of each device. In other words, transport path 14 is a transport path of workpiece holder 3 by the transport mechanism.

Figure 3A:
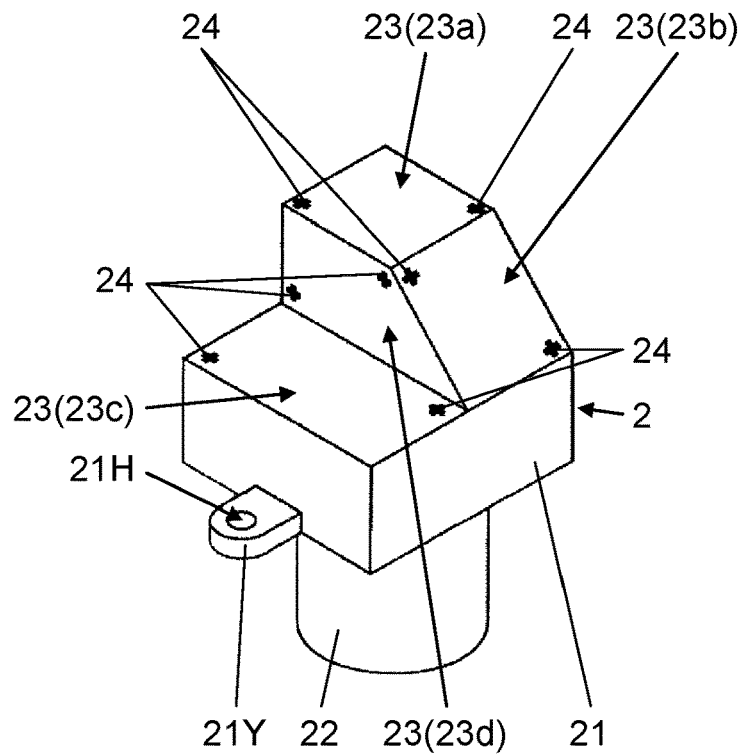
FIG. 3A is a perspective view of a workpiece and a component mounted body in the first exemplary embodiment of the disclosure.

As illustrated in FIG. 3A, each workpiece 2 has main body 21 and columnar extender 22 extending from main body 21. Here, as illustrated in FIG. 3A, a posture in which extender 22 extends downward is a reference posture of workpiece 2. Four surfaces (first surface 23a, second surface 23b, third surface 23c, and fourth surface 23d) as a plurality of mounting surfaces 23 are formed on main body 21.

In FIG. 3A, when workpiece 2 is in the reference posture, first surface 23a and third surface 23c are in a horizontal posture. Third surface 23c is positioned at a lower height than first surface 23a. Second surface 23b is a slope whose upper end is connected to first surface 23a. Fourth surface 23d is a vertical surface whose upper end is connected to first surface 23a and whose lower end is connected to third surface 23c. An electrode and a wiring pattern (not illustrated) for electrically connecting component PT are formed on each mounting surface 23.

In FIG. 3A, two ears 21Y are provided in main body 21 of each workpiece 2, which are in a posture overhanging and extending in the horizontal plane direction (lateral direction) when workpiece 2 is in the reference posture (one ear 21Y is not visible in FIG. 3A). Two ears 21Y are provided at symmetrical positions with respect to the vertical axis of extender 22. Each ear 21Y is provided with through-hole 21H penetrating in the vertical direction.

Figure 3B:
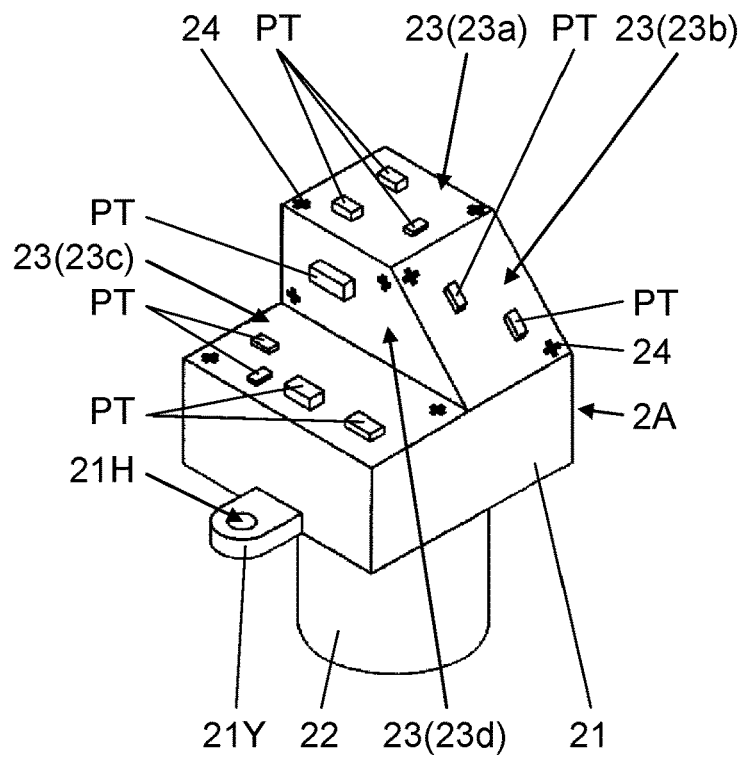
FIG. 3B is a perspective view of the workpiece and the component mounted body in the first exemplary embodiment of the disclosure.

As illustrated in FIG. 3B, the viscous body such as a solder or an adhesive is previously applied to a mounting portion of component PT in each mounting surface 23, and thereafter component PT is mounted. On the mounting surface 23, a plurality of recognition marks 24 are provided as indications when the viscous body is applied and when component PT is mounted (FIGS. 3A and 3B).

Figure 4:
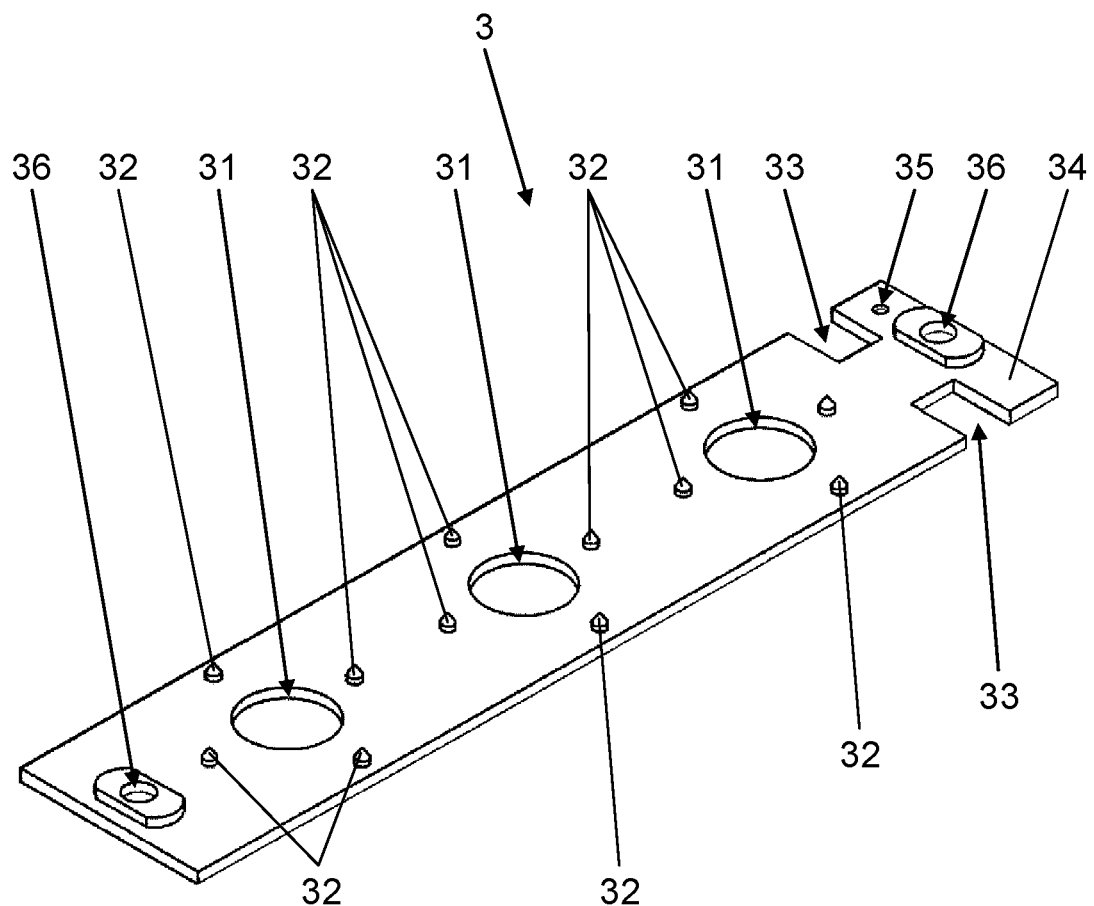
FIG. 4 is a perspective view of a workpiece holder provided in the component mounted body manufacturing system according to the first exemplary embodiment of the disclosure.

In FIG. 4, workpiece holder 3 includes a plate-shaped member extending in one direction and has a plurality (herein, three) of workpiece holding holes 31 arranged in a row in the longitudinal direction thereof. Each workpiece holding hole 31 has an inner diameter that is a size larger than the outer diameter of extender 22 of workpiece 2. A plurality of protrusions 32 are provided protruding upward around each workpiece holding hole 31 on the upper surface of workpiece holder 3. Two pairs of protrusions 32 are provided at positions symmetrical with respect to a center axis of workpiece holding hole 31. Here, two pairs of protrusions 32 are provided in two sets (four in total) at positions shifted by 90 degrees.

Figure 5A:
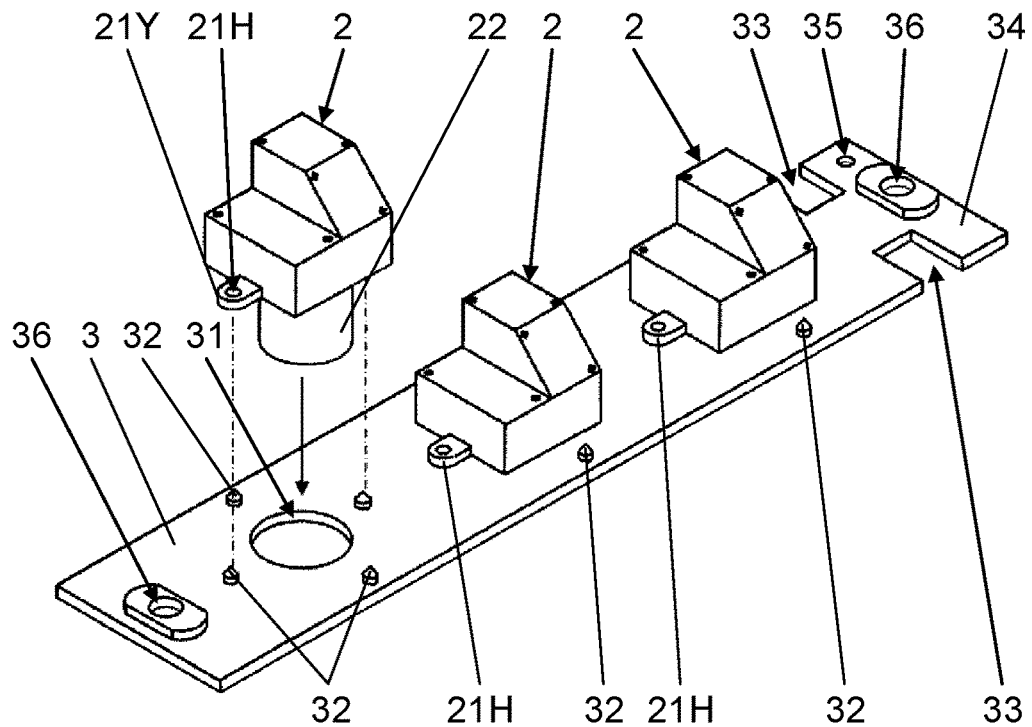
FIG. 5A is a perspective view illustrating the workpiece holder provided in the component mounted body manufacturing system according to the first exemplary embodiment of the disclosure together with the workpiece.
Figure 5B:
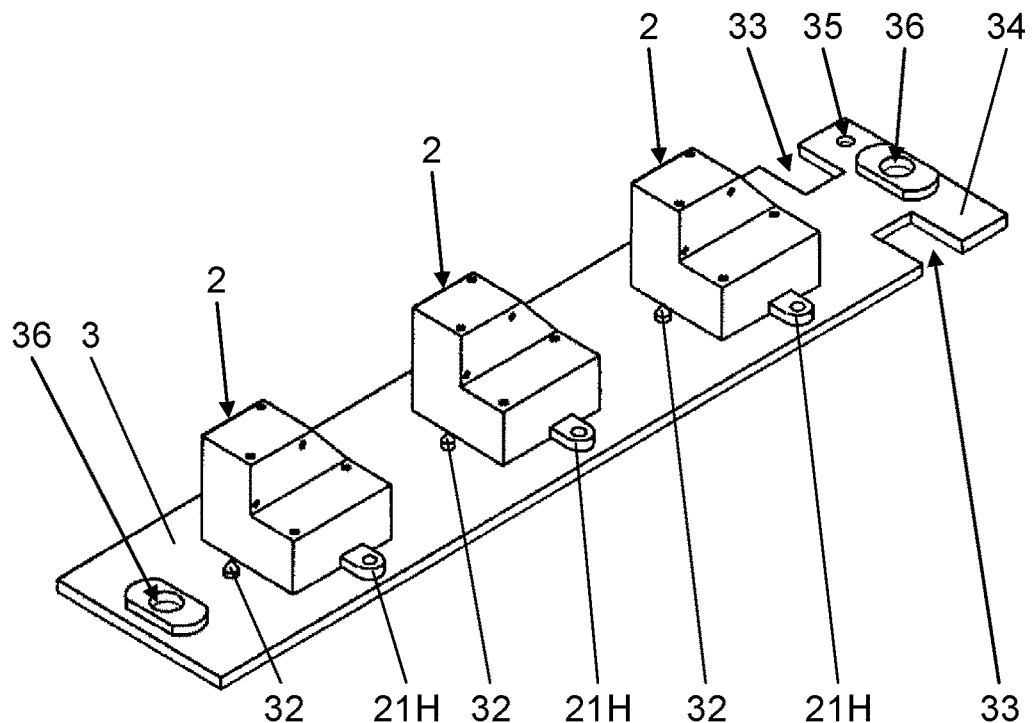
FIG. 5B is a perspective view illustrating the workpiece holder provided in the component mounted body manufacturing system according to the first exemplary embodiment of the disclosure together with the workpiece.

In FIGS. 4, 5A, and 5B, a pair of hollows 33 are provided at positions opposed to each other on one end 34 side of two long sides provided on workpiece holder 3. Carrier locking hole 35 is provided at end 34 of workpiece holder 3 on a side provided with the pair of hollows 33. Stage engaging holes 36 are respectively provided at both ends in the longitudinal direction of workpiece holder 3.

Figure 6:
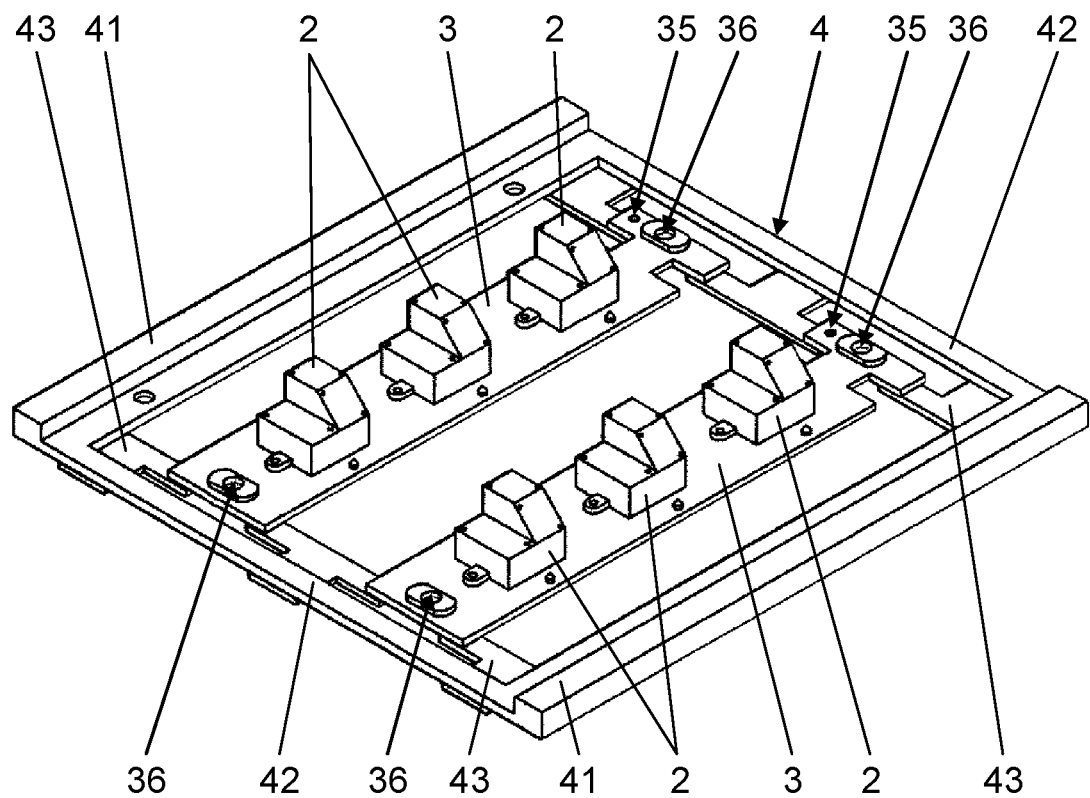
FIG. 6 is a perspective view illustrating the workpiece holder provided in the component mounted body manufacturing system according to the first exemplary embodiment of the disclosure with the workpiece together with a carrier.
Figure 7:
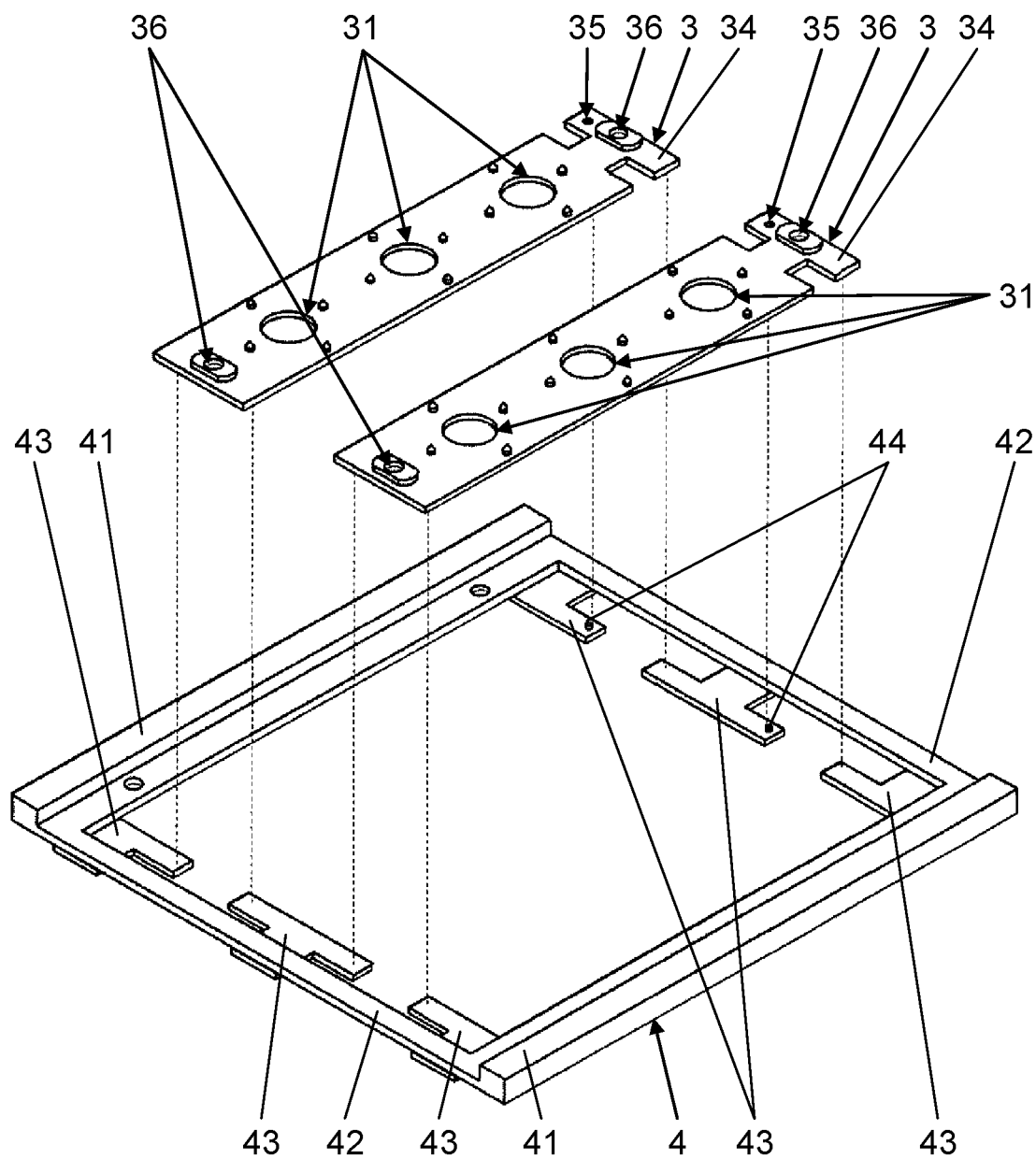
FIG. 7 is a perspective view illustrating the workpiece holder provided in the component mounted body manufacturing system according to the first exemplary embodiment of the disclosure together with the carrier.
Figure 8:
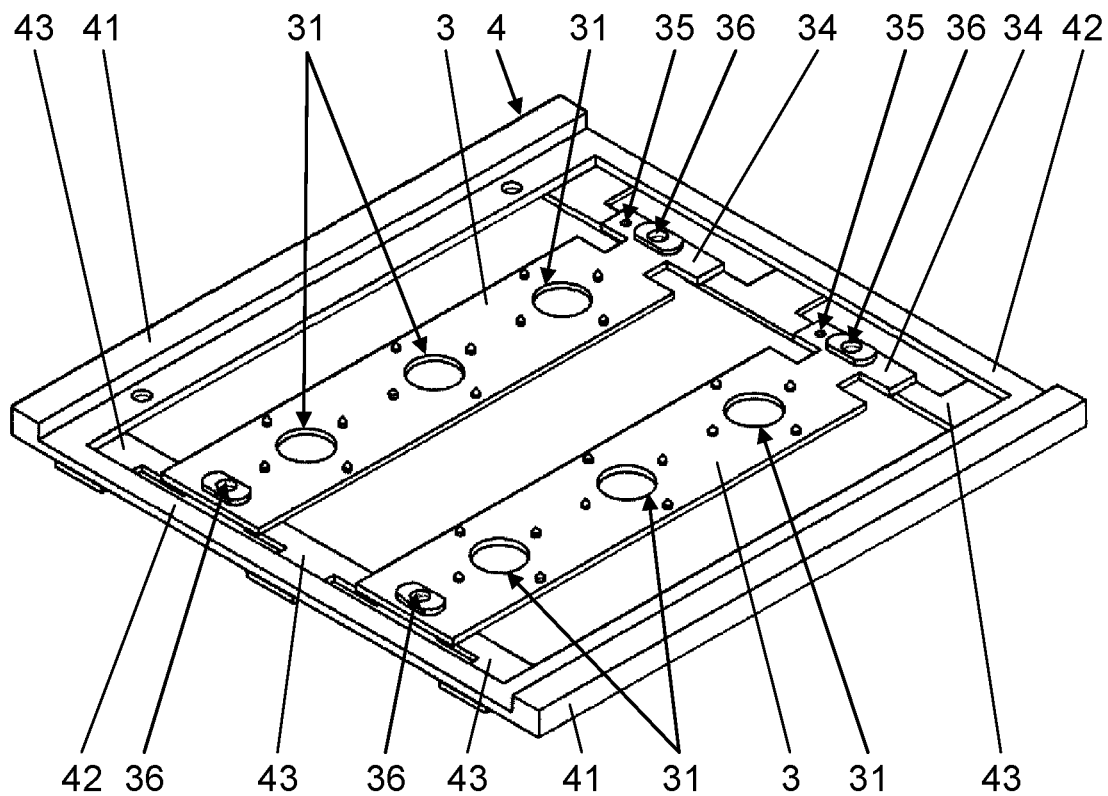
FIG. 8 is a perspective view illustrating the workpiece holder provided in the component mounted body manufacturing system according to the first exemplary embodiment of the disclosure together with the carrier.

In FIGS. 6, 7, and 8, carrier 4 is formed in a rectangular frame shape having two opposed longitudinal sides 41 and two opposed lateral sides 42. Each of the two lateral sides 42 is provided with holder support piece 43 supporting both longitudinal ends of workpiece holder 3 from below. On holder support piece 43 provided on one lateral side 42, projection 44 engaged with carrier locking hole 35 of workpiece holder 3 is formed to extend upward.

When holding workpiece 2 in workpiece holder 3, extender 22 of workpiece 2 is inserted from above into workpiece holding hole 31 (FIG. 5A→FIG. 5B). At this time, two protrusions 32 of workpiece holder 3 are fitted into two through-holes 21H of workpiece 2. In the exemplary embodiment, since workpiece holder 3 has a plurality (three) of workpiece holding holes 31 arranged in a row, it is possible to arrange in a row and hold a plurality of workpiece 2 of the number (three) of workpiece holding holes 31 (FIG. 5A, FIG. 5B).

In the exemplary embodiment, as described above, since two protrusions 32 are provided in two sets shifted by 90 degrees, workpiece 2 can be attached to workpiece holder 3 in two postures mutually shifted by 90 degrees around a vertical center axis of workpiece holding hole 31 (FIGS. 5A and 5B). Hereinafter, the posture of workpiece 2 when attached to workpiece holder 3 as illustrated in FIG. 5A is referred to as "first posture", and the posture of workpiece 2 when attached to workpiece holder 3 as illustrated in FIG. 5B is referred to as "second posture".

In order to change the posture of workpiece 2 attached to workpiece holder 3 in the "first posture" to the "second posture", first, workpiece 2 attached to workpiece holder 3 is raised and through-hole 21H is disengaged from two protrusions 32 of workpiece holder 3, so that workpiece 2 is removed from workpiece holder 3. Workpiece 2 is rotated by 90 degrees around a center axis of extender 22 (vertical center axis of workpiece holding hole 31) and thereafter lowered, and two through-holes 21H are fitted to two protrusions 32 different from the above, so that workpiece is attached to workpiece holder 3. The procedure of changing the posture of workpiece 2 attached to workpiece holder 3 in the "second posture" to the "first posture" is the same.

Figure 9A:
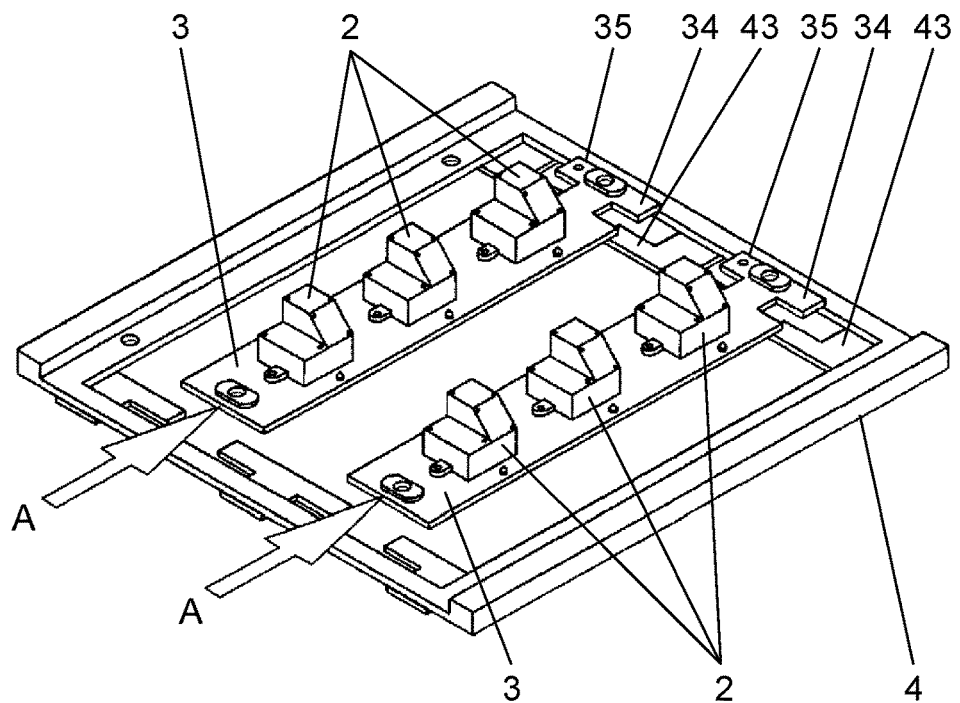
FIG. 9A is a perspective view illustrating the workpiece holder provided in the component mounted body manufacturing system according to the first exemplary embodiment of the disclosure with the workpiece together with the carrier.
Figure 9B:
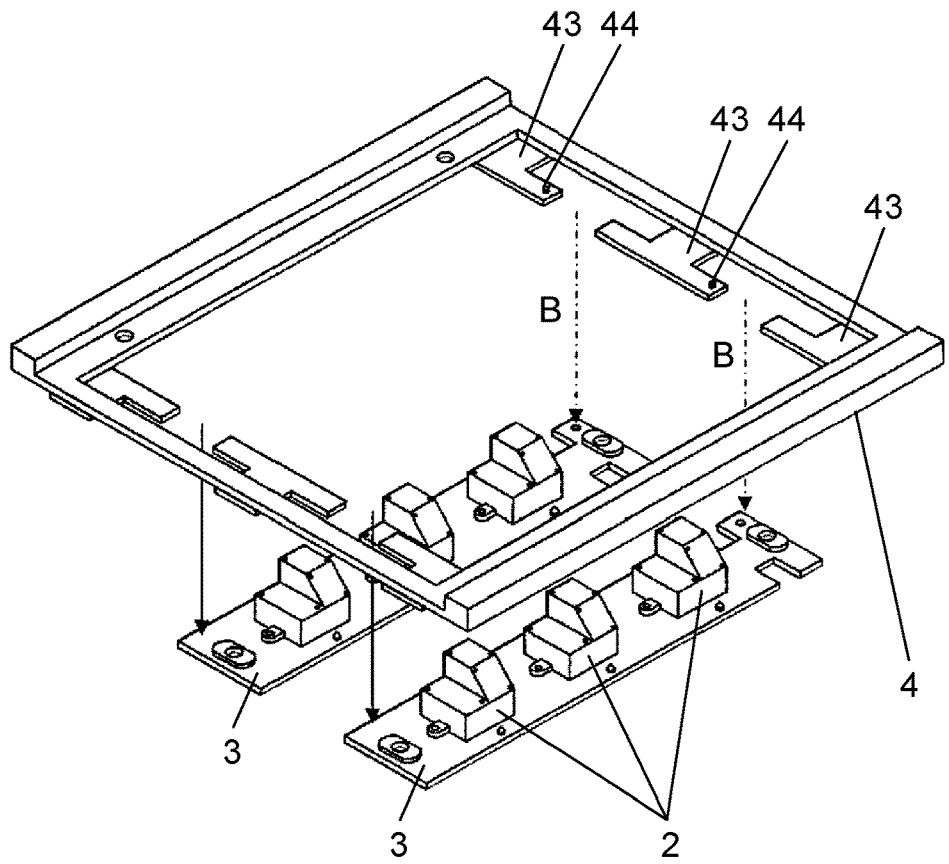
FIG. 9B is a perspective view illustrating the workpiece holder provided in the component mounted body manufacturing system according to the first exemplary embodiment of the disclosure with the workpiece together with the carrier.

When placing workpiece holder 3 holding workpiece 2 on carrier 4, both longitudinal ends of workpiece holder 3 are placed on two holder support pieces 43 from above (FIG. 6). At this time, carrier locking hole 35 of workpiece holder 3 is fitted into projection 44 of carrier 4 from above. when lifting workpiece holder 3 with respect to carrier 4 from this state, disengaging carrier locking holes 35 from projection 44, and shifting workpiece holder 3 in the longitudinal direction (arrow A illustrated in FIG. 9A), the pair of hollows 33 of workpiece holder 3 and end of holder support piece 43 of carrier 4 coincide with each other vertically (FIG. 9A). When workpiece holder 3 is lowered relative to carrier 4 from this state (arrow B illustrated in FIG. 9B), workpiece holder 3 is pulled out below carrier 4 and separated from carrier 4 (FIG. 9B).

Figure 10:
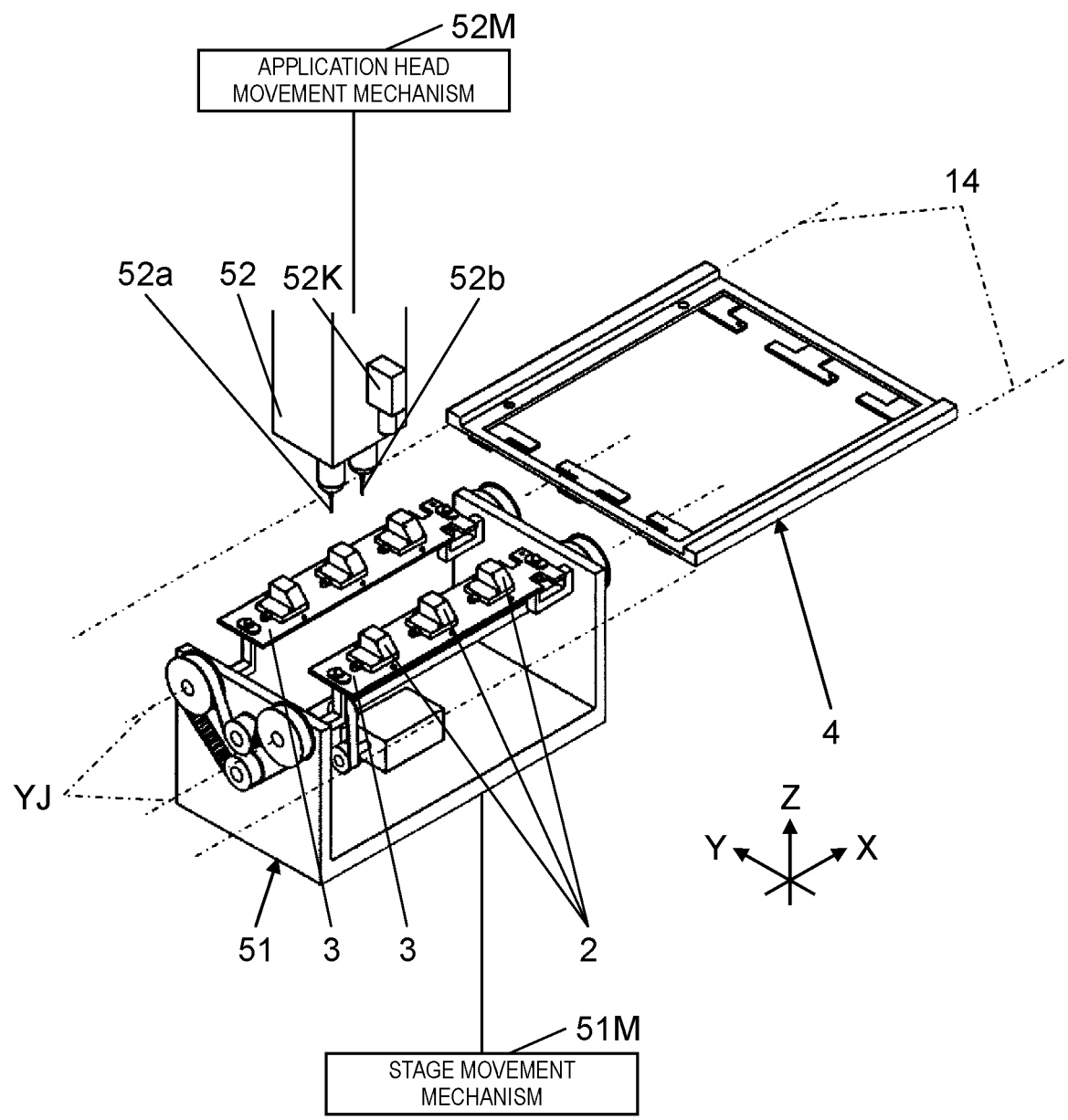
FIG. 10 is a perspective view of a principal part of an applicator constituting the component mounted body manufacturing system according to the first exemplary embodiment of the disclosure.
Figure 11:
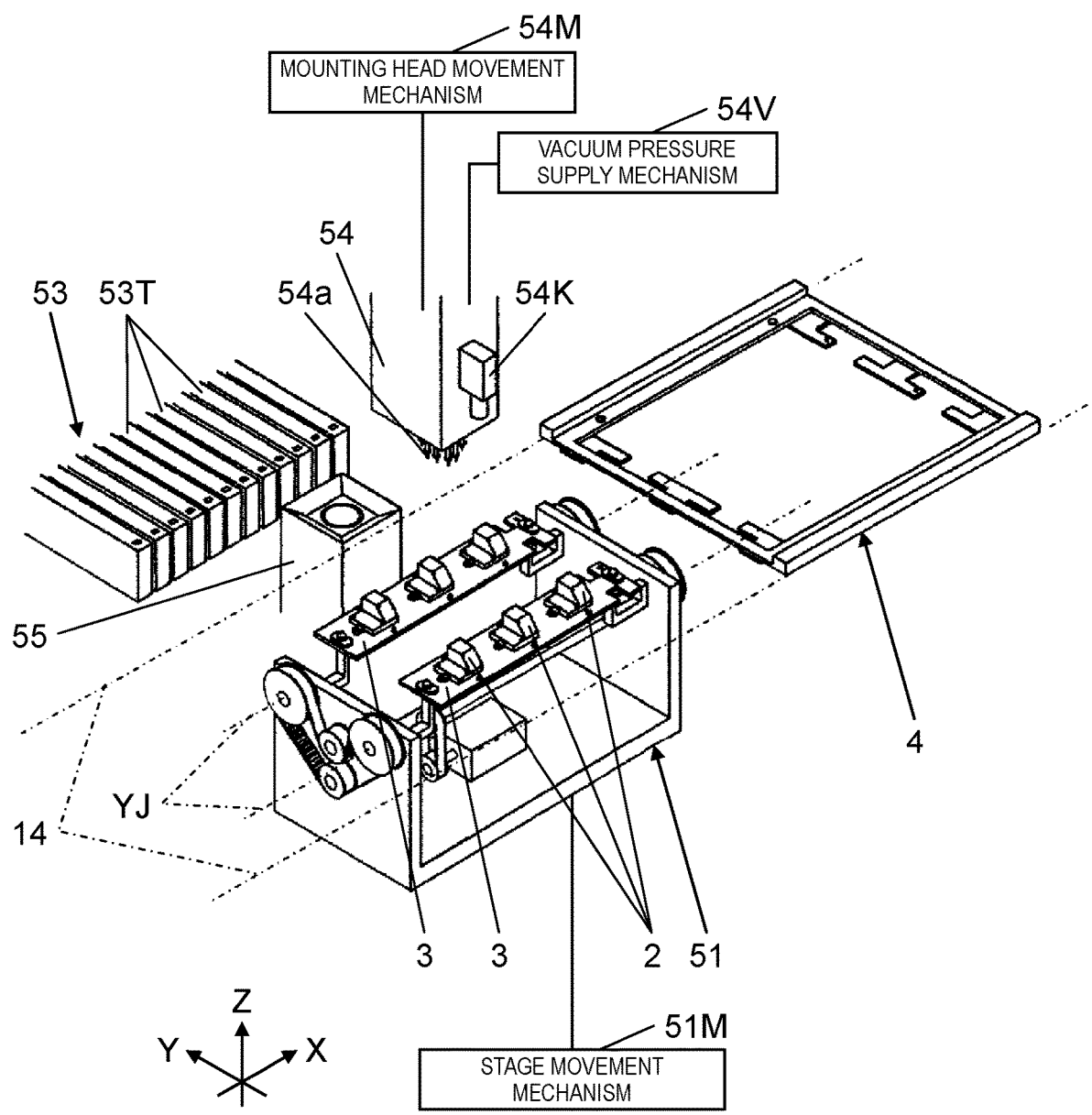
FIG. 11 is a perspective view of a principal part of a mounter constituting the component mounted body manufacturing system according to the first exemplary embodiment of the disclosure.

As illustrated in FIGS. 2 and 10, applicators 11 (applicator 11A and applicator 11B) are provided with work stage 51 as a positioning mechanism of workpiece 2 and application head 52. As illustrated in FIGS. 2 and 11, mounters 12 (mounter 12A and mounter 12B) are provided with work stage 51 as the positioning mechanism of workpiece 2, component supplier 53, mounting head 54, and component camera 55. Work stage 51 of applicator 11 and work stage 51 of mounter 12 have the same configuration.

As illustrated in FIGS. 10 and 11, work stage 51 is disposed below transport path 14. Work stage 51 has a mechanism for rocking workpiece holder 3 holding workpiece 2 around lateral rocking axis YJ (in detail, extending in X axis direction)

Figure 12:
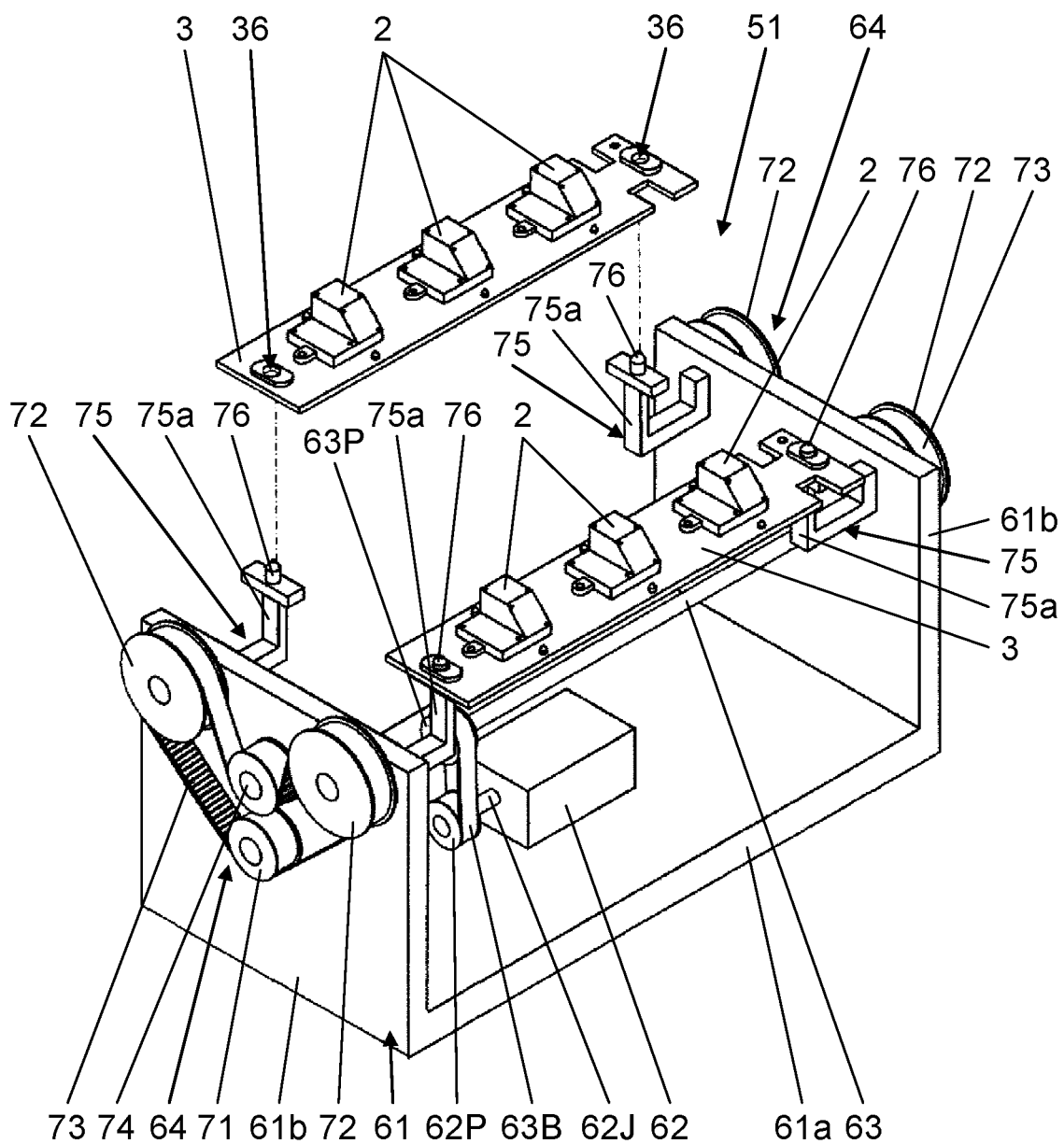
FIG. 12 is a perspective view illustrating a work stage provided in the component mounted body manufacturing system according to the first exemplary embodiment of the disclosure together with the workpiece holder with the workpiece.
Figure 13:
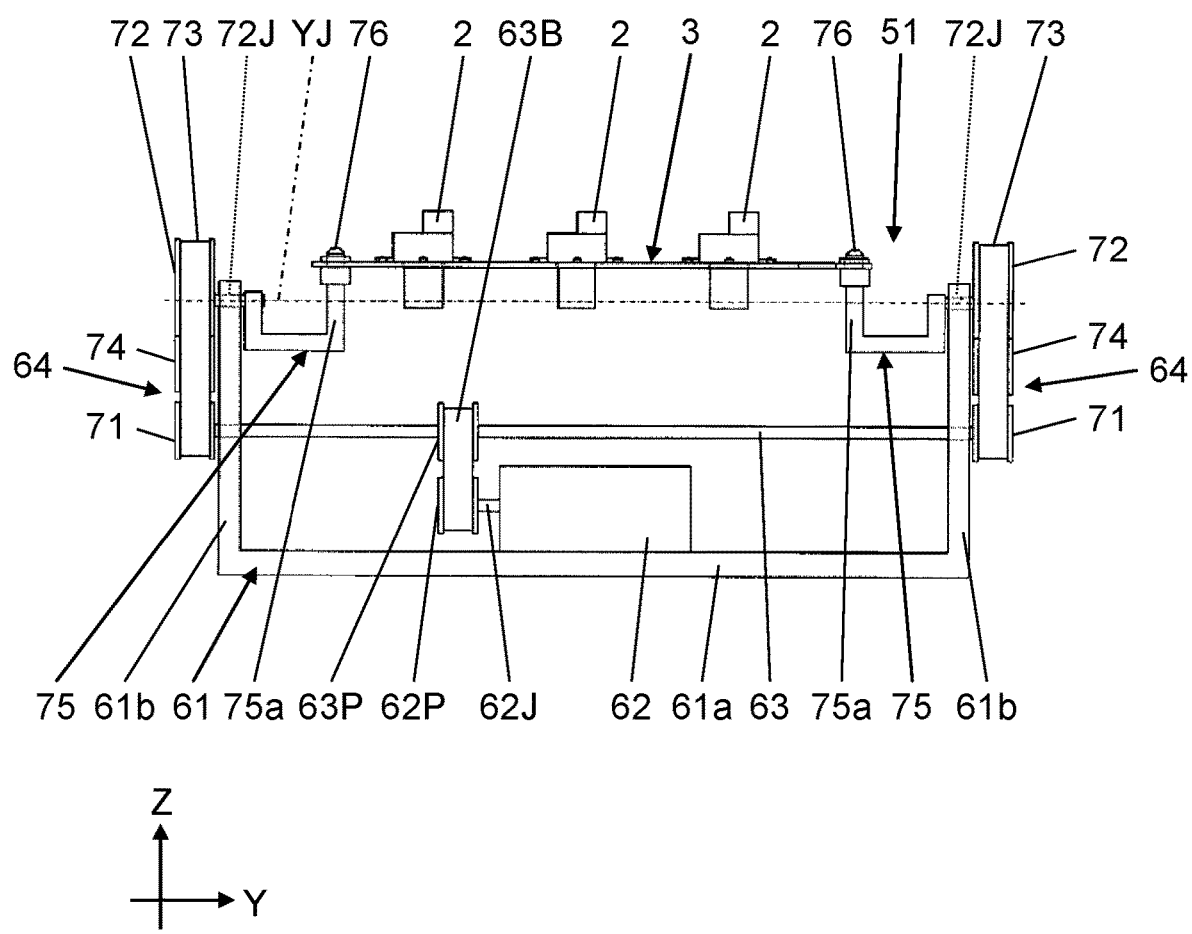
FIG. 13 is a side view illustrating the work stage provided in the component mounted body manufacturing system according to the first exemplary embodiment of the disclosure together with the workpiece holder with the workpiece.

In FIGS. 12 and 13, work stage 51 is provided with base 61, rocking motor 62, transmission shaft 63, and two synchronous drive mechanisms 64. Base 61 has horizontal portion 61a and two upright portions 61b extending vertically upward from both ends in the X axis direction of horizontal portion 61a. Rocking motor 62 is provided on upper surface of horizontal portion 61a, and has output shaft 62J facing in the X axis direction. Output shaft pulley 62P is attached to a tip of output shaft 62J. Transmission shaft 63 extends in the X axis direction above horizontal portion 61a, and both ends of transmission shaft 63 penetrate two upright portions 61b. Transmission shaft pulley 63P is provided on transmission shaft 63. Transmission shaft pulley 63P is positioned above output shaft pulley 62P and is connected to output shaft pulley 62P by transmission belt 63B.

In FIGS. 12 and 13, two synchronous drive mechanisms 64 are provided in each of two upright portions 61b. Each of synchronous drive mechanisms 64 has driving pulley 71 attached to an end of transmission shaft 63 protruding outwardly from upright portion 61b, and two driven pulleys 72 disposed above driving pulley 71 with driving pulley 71 interposed therebetween. Driving pulley 71 and two driven pulleys 72 are connected by timing belt 73, and tension pulley 74 for applying an appropriate tension to timing belt 73 is disposed in an intermediate portion between two driven pulleys 72. Between two synchronous drive mechanisms 64, driven pulleys 72 are positioned opposed to each other in the X axis direction.

In FIG. 13, rotating shaft 72J of each driven pulley 72 penetrates upright portion 61b in the X axis direction, projects and extends into a space between two upright portions 61b, and holder supporting member 75 is attached to an end of protruding rotating shaft 72J (refer to also FIG. 12). Holder supporting member 75 has arm 75a, and arm 75a rocks within the upper and lower surfaces (YZ surface) around rocking axis YJ serving as an axis of rotating shaft 72J of driven pulley 72.

When rocking motor 62 rotates output shaft 62J, transmission shaft 63 rotates around the X axis via output shaft pulley 62P, transmission belt 63B, and transmission shaft pulley 63P. As a result, in two synchronous drive mechanisms 64, driving pulley 71 rotates synchronously and four driven pulleys 72 rotate synchronously in the same direction via two timing belts 73. As a result, four arms 75a rock synchronously in the same direction. Since four holder supporting members 75 are previously attached so that arms 75a are parallel to each other, when transmission shaft 63 rotates, two arms 75a opposed to each other in the X axis direction rock synchronously around rocking axis YJ. As a result, four arms 75a rock in a state of supporting the parallel postures in synchronization with the direction corresponding to the rotation direction of output shaft 62J of rocking motor 62.

In FIGS. 12 and 13, support protrusion 76 is provided protruding upward at tip ends of four arms 75a. The distance between two support protrusions 76 opposed to each other in the X axis direction coincides with the distance between two stage locking holes 36 of workpiece holder 3. Therefore, when two stage locking holes 36 of workpiece holder 3 are fitted into two support protrusions 76 provided in work stage 51 from above, both ends of workpiece holder 3 can be supported by two arms 75a (FIGS. 12 and 13). At this time, since the longitudinal direction (arrangement direction of workpiece) of workpiece holder 3 coincides with an extending direction of rocking axis YJ, workpiece holder 3 holds the plurality of workpiece 2 in a state of being arranged in the extending direction of rocking axis YJ.

Figure 14A:
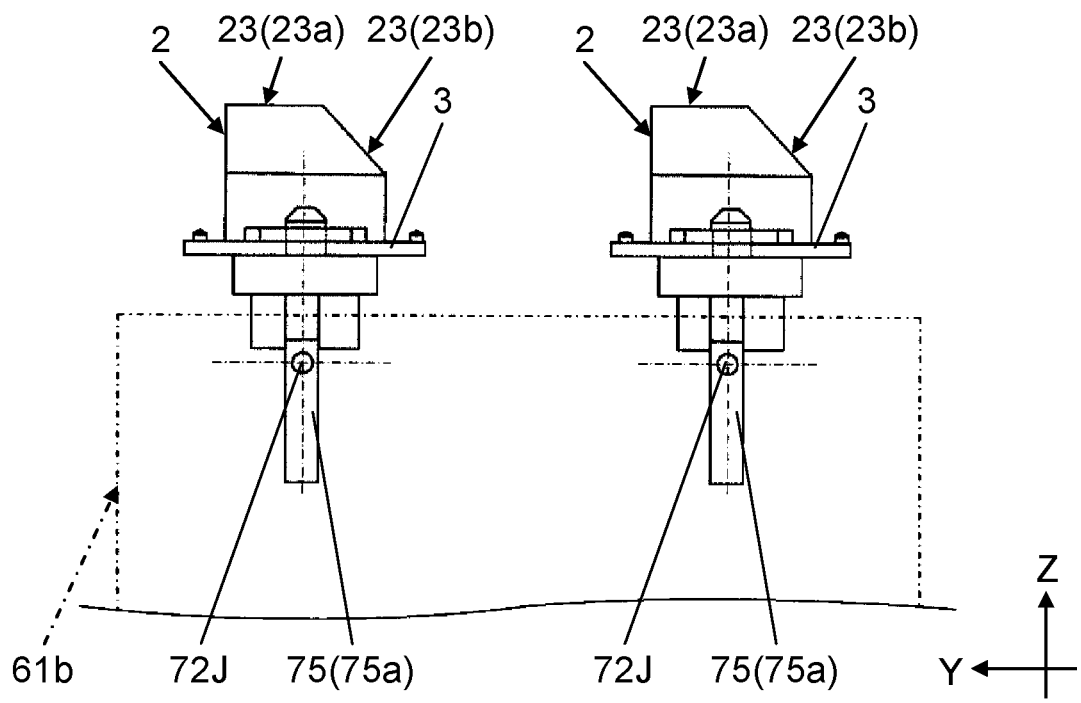
FIG. 14A is a partial side view of the work stage provided in the component mounted body manufacturing system according to the first exemplary embodiment of the disclosure.
Figure 14B:
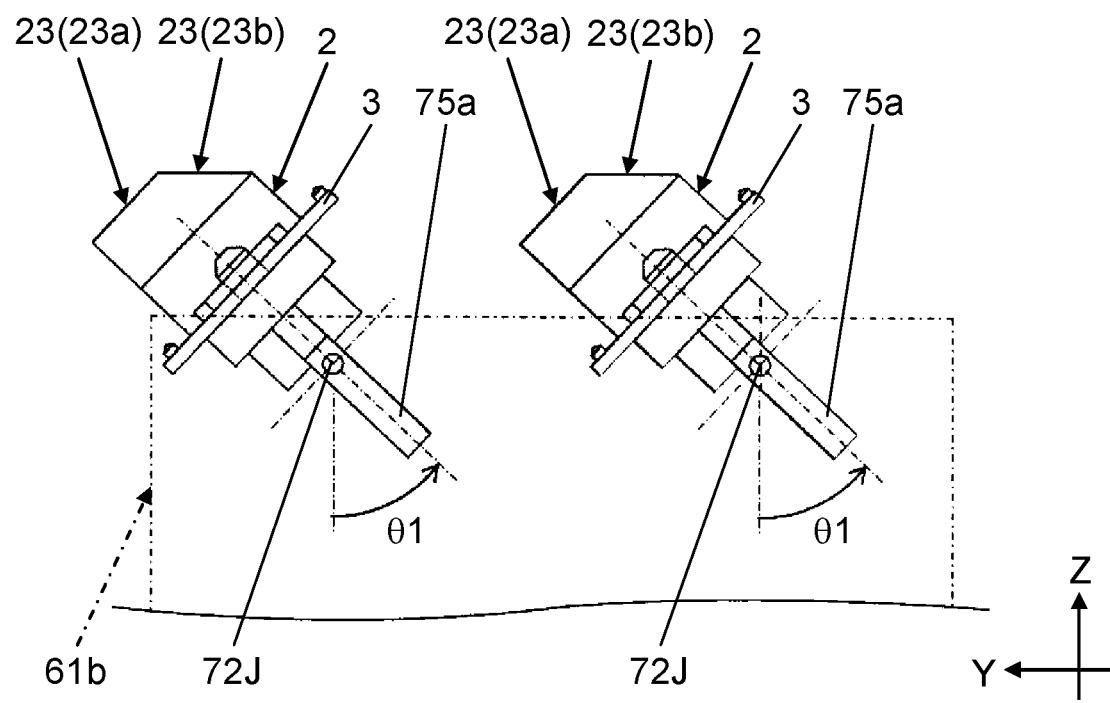
FIG. 14B is a partial side view of the work stage provided in the component mounted body manufacturing system according to the first exemplary embodiment of the disclosure.
Figure 15A:
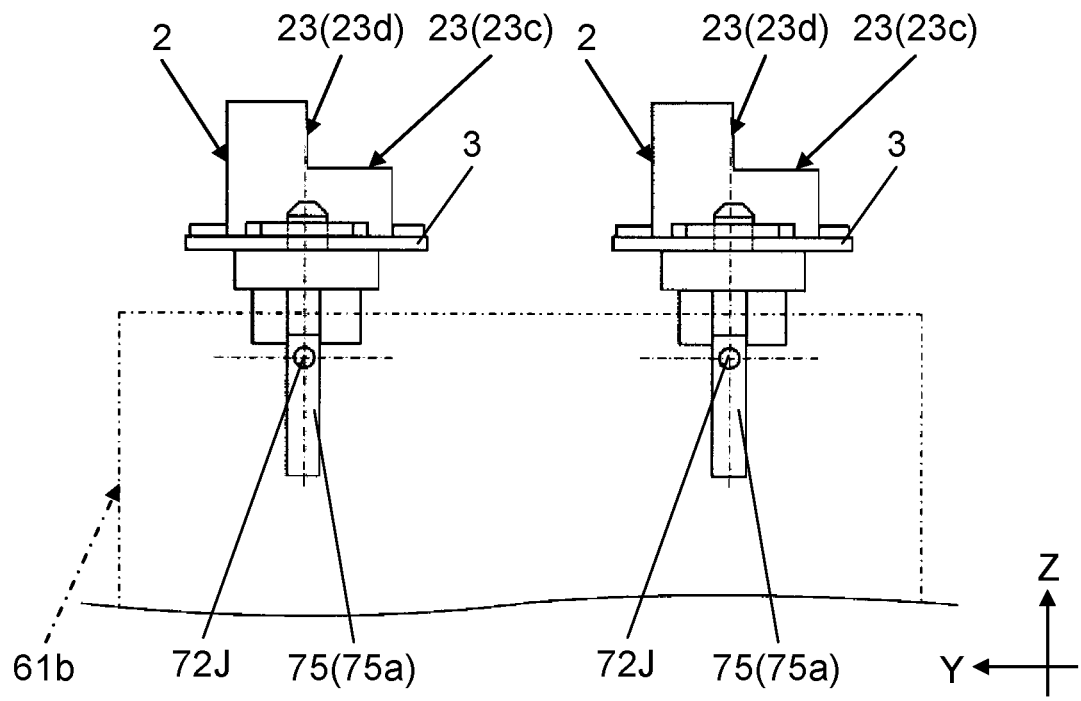
FIG. 15A is a partial side view of the work stage provided in the component mounted body manufacturing system according to the first exemplary embodiment of the disclosure.
Figure 15B:
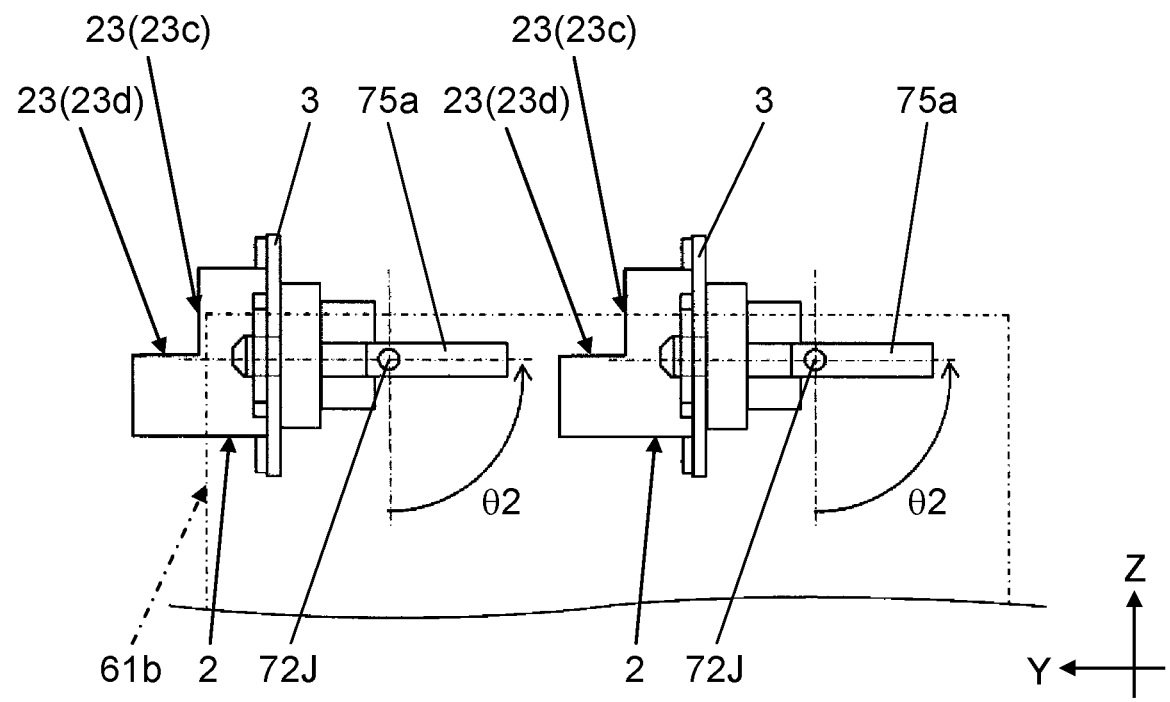
FIG. 15B is a partial side view of the work stage provided in the component mounted body manufacturing system according to the first exemplary embodiment of the disclosure.

When transmission shaft 63 is rotated around the X axis in a state where workpiece holder 3 holding workpiece 2 is supported by arm 75a, two arms 75a opposed to each other in the X axis direction rock synchronously around lateral rocking axis YJ. Workpiece 2 held by workpiece holder 3 in the "first posture" (FIG. 5A) can take a posture in which first surface 23a is horizontal (FIG. 14A) and a posture in which second surface 23b is horizontal (FIG. 14B). Similarly, Workpiece 2 held by workpiece holder 3 in the "second posture" (FIG. 5B) can take a posture in which third surface 23c is horizontal (FIG. 15A) and a posture in which fourth surface 23d is horizontal (FIG. 15B).

In FIGS. 10 and 11, stage movement mechanism 51M is provided in each of applicator 11 and mounter 12. These stage movement mechanisms 51M move work stage 51 up and down and in the horizontal direction.

In FIG. 10, application head 52 provided in applicator 11 is provided with solder applying nozzle 52a for discharging a solder and adhesive applying nozzle 52b for discharging an adhesive, the solder and the adhesive can be selectively discharged and applied to each mounting surface 23. Application head 52 is moved in the horizontal plane direction by application head movement mechanism 52M. In FIG. 10, applicator 11 is provided with application head recognition camera 52K with an imaging optical axis faced downward. Application head recognition camera 52K is attached to application head 52 and moves in the horizontal direction integrally with application head 52.

In FIG. 11, component supplier 53 of mounter 12 includes a plurality of tape feeders 53T here. Each tape feeder 53T supplies component PT to a component supply port opened to transport path 14 side. Mounting head 54 is provided with a plurality of suction nozzles 54a extending downward and mounting head recognition camera 54K. Mounting head 54 is moved in the horizontal plane direction by mounting head movement mechanism 54M, and recognizes above-described recognition mark 24 provided on workpiece 2.

Each suction nozzle 54a of mounting head 54 is moved in the vertical direction by a nozzle drive mechanism (not illustrated) provided in mounting head 54 and rotated around the vertical axis. In FIG. 11, mounting head 54 is connected to vacuum pressure supply mechanism 54V. When a vacuum pressure is supplied from vacuum pressure supply mechanism 54V to mounting head 54, vacuum suction force is generated at a lower end of each suction nozzle 54a. Mounting head 54 picks up component PT by sucking component PT supplied by component supplier 53 to each suction nozzle 54a. Mounting head recognition camera 54K has the imaging optical axis faced downward, moves integrally with mounting head 54 in the horizontal direction, and recognizes recognition mark 24 provided in workpiece 2.

In FIG. 11, component camera 55 is provided between transport path 14 and component supplier 53 in a state where the imaging optical axis is faced upward. Component camera 55 recognizes component PT picked up by mounting head 54.

Figure 16:
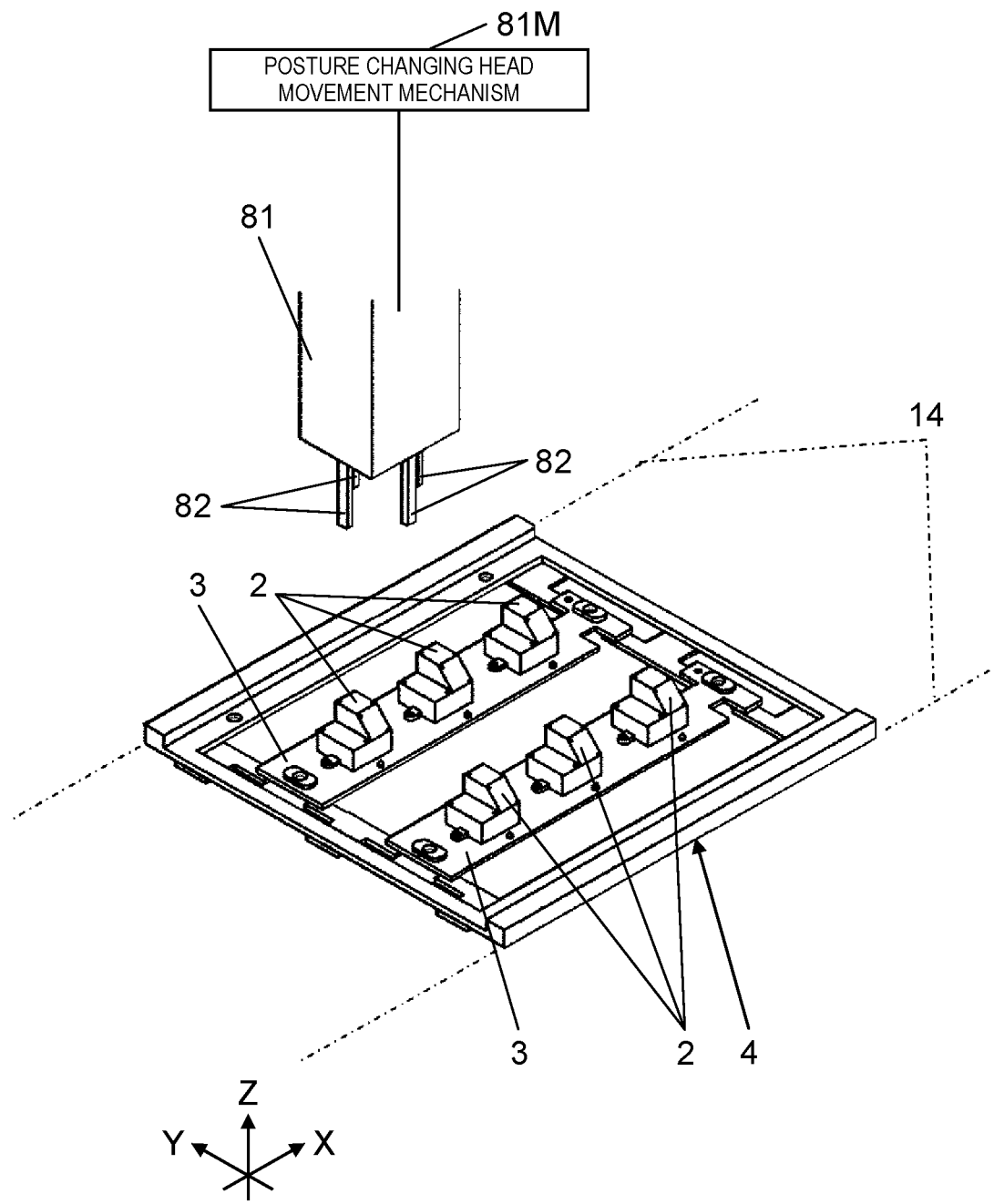
FIG. 16 is a perspective view of a principal part of a posture changer constituting the component mounted body manufacturing system according to the first exemplary embodiment of the disclosure.

In FIGS. 2 and 16, posture changers 13 (posture changer 13A and posture changer 13B) are provided with posture changing head 81. As illustrated in FIGS. 17A and 17B, posture changing head 81 is provided with a plurality of fingers 82. Posture changing head 81 is moved in the horizontal plane direction by posture changing head movement mechanism 81M (FIG. 16).

Posture changing head 81 grips and lifts workpiece 2 held by workpiece holder 3 by a plurality of fingers 82. As a result, when two through-holes 21H of workpiece 2 are disengaged from two protrusions 32 of workpiece holder 3, posture changing head 81 rotates around the vertical axis to rotate workpiece 2 around the axis of extender 22 (that is, around the vertical center axis of workpiece holding hole 31) by 90 degrees (FIG. 17A→FIG. 17B). Workpiece 2 is lowered so that two through-holes 21H fit into two protrusions 32 different from the above. As a result, the posture of workpiece 2 for workpiece holder 3 is changed. As described above, in the exemplary embodiment, posture changing head 81 is a posture change mechanism for changing the posture of workpiece 2 in workpiece holder 3.

Next, a flow of the manufacturing work of the component mounted body performed by component mounted body manufacturing system 1 in the first exemplary embodiment will be described. In component mounted body manufacturing system 1 in the first exemplary embodiment, the applying work of the viscous body is first performed on each workpiece 2 by two applicators 11 (applicator 11A and applicator 11B). Next, the mounting work of component PT is performed to each workpiece 2 by two mounters 12 (mounter 12A and mounter 12B). The work of mounting the component and the work of applying the viscous bodys are an example of predetermined work according to the disclosure.

In the manufacturing work of the component mounted body, two workpiece holders 3 are first prepared, which are attached so that a plurality of (herein, three) workpiece 2 is "first posture" (FIG. 5A). Carrier 4 on which these two workpiece holders 3 are placed is transported by transport path 14 and positioned at an applying work position above working stage 51 of applicator 11A.

When two workpiece holders 3 are positioned at the applying work position of applicator 11A, stage movement mechanism 51M is operated to raise work stage 51, and four support protrusions 76 provided in work stage 51 are fitted into two stage locking holes 36 provided in each of two workpiece holders 3 from below. Work stage 51 further rises to lift up two workpiece holders 3 and to separate two workpiece holders 3 from carrier 4.

When two workpiece holders 3 are separated from carrier 4, transport path 14 slightly moves carrier 4 in the X axis direction, and after two workpiece holders 3 is moved relatively to carrier 4 in the X axis direction (arrow A illustrated in FIG. 9A), stage movement mechanism 51M of applicator 11A lowers work stage 51 (arrow B illustrated in FIG. 9B). As a result, two workpiece holders 3 are pulled out below carrier 4 (FIG. 9B), and two workpiece holders 3 are separated from carrier 4. When two workpiece holders 3 are separated from carrier 4, transport path 14 moves carrier 4 in the X axis direction and places carrier 4 in a standby state retracted from above work stage 51 (FIG. 10).

When carrier 4 enters the standby state, stage movement mechanism 51M of applicator 11A raises work stage 51. In this state, since first surface 23a of each workpiece 2 is in a horizontal posture, the viscous body is applied to first surface 23a, and first surface 23a faces upward which is a predetermined direction to be worked where component PT is mounted (FIG. 14A), application head 52 of applicator 11A first applies the viscous body to first surface 23a of each workpiece 2.

When application head 52 of applicator 11A applies the viscous body to first surface 23a of each workpiece 2, rocking motor 62 is activated to drive two synchronous drive mechanisms 64 and to rock two workpiece holders 3 around rocking axis YJ, respectively. At this time, two workpiece holders 3 synchronously rock in the same direction only by the same angle (angle θ1 illustrated in FIG. 14B). As a result, the posture of the plurality of workpiece 2 held in two workpiece holders 3 are collectively adjusted, and second surface 23b of each workpiece 2 is in a horizontal posture to face the direction to be worked (upward) (FIG. 14B). When second surface 23b of each workpiece 2 faces the direction to be worked, application head 52 of applicator 11A applies the viscous body to second surface 23b of each workpiece 2.

When application head 52 of applicator 11A applies the viscous body to second surface 23b of each workpiece 2, rocking motor 62 operates to rock two workpiece holders 3 in the opposite direction only by the angle θ1 and to return each workpiece 2 to the original posture. Work stage 51 and transport path 14 operate in the reverse order of the above procedure to place two workpiece holders 3 on carrier 4 positioned at the applying work position. When two workpiece holders 3 are placed on carrier 4, transport path 14 operates to transport carrier 4 to the downstream side and to position two workpiece holders 3 at a posture changing work position of posture changer 13A.

When two workpiece holders 3 are positioned at the posture changing work position of posture changer 13A, posture changing head 81 of posture changer 13A operates to sequentially change the posture of each workpiece 2 held in two workpiece holders 3 from the "first posture" (FIG. 5A) to the "second posture" (FIG. 5B). When the posture change of all workpiece 2 held by two workpiece holders 3 is completed, transport path 14 transports carrier 4 to the downstream side and positions two workpiece holders 3 at the applying work position above work stage 51 provided in applicator 11B. When two workpiece holders 3 are positioned at the applying work position of applicator 11B, applicator 11B separates two workpiece holders 3 from carrier 4 and places carrier 4 in a standby state.

When carrier 4 enters the standby state, stage movement mechanism 51M of applicator 11B raises work stage 51. In this state, since third surface 23c of each workpiece 2 is in the horizontal posture and faces the direction to be worked (upward) (FIG. 15A), application head 52 of applicator 11B firstly applies the viscous body to third surface 23c of each workpiece 2. When application head 52 of applicator 11B applies the viscous body to third surface 23c of each workpiece 2, rocking motor 62 operates to drive two synchronous drive mechanisms 64 to rock two workpiece holder 3 around rocking axis YJ, respectively. At this time, two workpiece holders 3 synchronously rock in the same direction only by the same angle (angle 62 illustrated in FIG. 15B). As a result, the posture of the plurality of workpieces 2 held in two workpiece holders 3 are collectively adjusted, and fourth surface 23d of each workpiece 2 is in the horizontal posture to face the direction to be worked (FIG. 15B). When fourth surface 23d of each workpiece 2 faces the direction to be worked, application head 52 applies the viscous body to fourth surface 23d of each workpiece 2.

When application head 52 of applicator 11B applies the viscous body to fourth surface 23d of each workpiece 2, rocking motor 62 operates to rock two workpiece holders 3 in the opposite direction only by the angle θ2 and to return each workpiece 2 to the original posture. Work stage 51 and transport path 14 operate in the reverse order to place two workpiece holders 3 on carrier 4 positioned at the applying work position. When two workpiece holders 3 are placed on carrier 4, transport path 14 operates to transport carrier 4 to the downstream side and to position two workpiece holders 3 at a mounting work position above work stage 51 provided in mounter 12A.

When two workpiece holders 3 are positioned at the mounting work position of mounter 12A, mounter 12A pulls out two workpiece holders 3 from carrier 4 by the same operation as applicator 11 and places carrier 4 in a standby state (FIG. 11). When carrier 4 enters the standby state, stage movement mechanism 51M of mounter 12A raises work stage 51. In this state, third surface 23c of each workpiece 2 is in a horizontal posture and faces the direction to be worked (upward) (FIG. 15A), mounting head 54 of mounter 12A first mounts component PT on third surface 23c of each workpiece 2.

In the mounting of component PT, component supplier 53 first supplies component PT, and mounting head 54 picks up component PT by suction nozzle 54a. Mounting head 54 passes above component camera 55 and causes component camera 55 to recognize each component PT. When mounting head 54 causes component camera 55 to recognize each component PT, mounting head 54 moves above workpiece holder 3 held in work stage 51 and mounts component PT on mounting surface 23 of workpiece 2.

When mounting head 54 of mounter 12A mounts component PT on third surface 23c of each workpiece 2, rocking motor 62 operates to drive two synchronous drive mechanisms 64 and to rock two workpiece holders 3 around rocking axis YJ respectively. At this time, two workpiece holders 3 synchronously rock in the same direction only by the same angle (angle θ2 illustrated in FIG. 15B). As a result, the posture of the plurality of workpieces 2 held in two workpiece holders 3 are collectively adjusted, and fourth surface 23d of each workpiece 2 is in the horizontal posture to face the direction to be worked (upward) (FIG. 15B). When fourth surface 23d of each workpiece 2 faces the direction to be worked, mounting head 54 of mounter 12A mounts component PT on fourth surface 23d of each workpiece 2.

When mounting head 54 of mounter 12A mounts component PT to fourth surface 23d of each workpiece 2, rocking motor 62 operates to rock two workpiece holders 3 in the opposite direction only by the angle θ2 and to return each workpiece 2 to the original posture. Work stage 51 and transport path 14 operate in the reverse order to place two workpiece holders 3 on carrier 4 positioned at the applying work position. When two workpiece holders 3 are placed on carrier 4, transport path 14 operates to transport carrier 4 to the downstream side and to position two workpiece holders 3 at a posture changing work position of posture changer 13B.

When two workpiece holders 3 are positioned at the posture changing work position of posture changer 13B, posture changing head 81 of posture changer 13B operates to sequentially change the posture of each workpiece 2 held in two workpiece holders 3 from the "second posture" (FIG. 5B) to the "first posture" (FIG. 5A). When the posture change of all workpiece 2 held by two workpiece holders 3 is completed, transport path 14 transports carrier 4 to the downstream side and positions two workpiece holders 3 at the mounting work position above work stage 51 provided in mounter 12B.

When two workpiece holders 3 are positioned at the mounting work position of mounter 12B, mounter 12B pulls out two workpiece holders 3 from carrier 4 by the same operation as mounter 12A and places carrier 4 in a standby state. When carrier 4 enters the standby state, stage movement mechanism 51M of mounter 12B raises work stage 51. In this state, first surface 23a of each workpiece 2 is in a horizontal posture and faces the direction to be worked (upward) (FIG. 14A), mounting head 54 of mounter 12B first mounts component PT on first surface 23a of each workpiece 2.

When mounting head 54 of mounter 12B mounts component PT on first surface 23a of each workpiece 2, rocking motor 62 operates to drive two synchronous drive mechanisms 64 and to rock two workpiece holders 3 around rocking axis YJ respectively. At this time, two workpiece holders 3 synchronously rock in the same direction only by the same angle (angle θ1 illustrated in FIG. 14B). As a result, the posture of the plurality of workpieces 2 held in two workpiece holders 3 are collectively adjusted, and second surface 23b of each workpiece 2 is in the horizontal posture to face the direction to be worked (upward) (FIG. 14B). When second surface 23b of each workpiece 2 faces the direction to be worked, mounting head 54 of mounter 12B mounts component PT on second surface 23b of each workpiece 2.

When mounting head 54 of mounter 12B mounts component PT to second surface 23b of each workpiece 2, rocking motor 62 operates to rock two workpiece holders 3 in the opposite direction only by the angle θ1 and to return each workpiece 2 to the original posture. Work stage 51 and transport path 14 operate in the reverse order to place two workpiece holders 3 on carrier 4 positioned at the mounting work position. When two workpiece holders 3 are placed on carrier 4, transport path 14 operates to transport carrier 4 to the downstream side. As a result, the component mounting work for the plurality of workpieces 2 corresponding to one carrier 4 (corresponding to two of workpiece holder 3) is completed.

As described above, in component mounted body manufacturing system 1 in the first exemplary embodiment, work stage 51 provided in mounter 12A is the first positioning mechanism for rocking workpiece holder 3 holding workpiece 2 around lateral rocking axis YJ, and positioning workpiece 2 so that one mounting surfaces 23 (third surface 23c and fourth surface 23d) of workpiece 2 face the predetermined direction to be worked. In addition, mounting head 54 provided in mounter 12A is the first mounting head for mounting components PT on one mounting surfaces 23 (third surface 23c and fourth surface 23d) of workpiece 2 positioned by working stage 51 (first positioning mechanism) provided in mounter 12A. Here, the first mounting head is an example of the first working head according to the disclosure.

In addition, in component mounted body manufacturing system 1 in the first exemplary embodiment, the transport mechanism for transporting carrier 4 along transport path 14 is the transport mechanism for transporting workpiece holder 3 holding workpiece 2 to the downstream side. In addition, posture changing head 81 provided in posture changer 13B is the posture change mechanism for changing the posture of workpiece 2 on which components PT are mounted on one mounting surfaces 23 (third surface 23c and fourth surface 23d) in workpiece holder 3.

In addition, in component mounted body manufacturing system 1 in the first exemplary embodiment, work stage 51 provided in mounter 12B is the second positioning mechanism for rocking workpiece holder 3 in which the posture of workpiece 2 is changed by posture changing head 81 (posture change mechanism) provided in posture changer 13B around lateral rocking axis YJ so as to position workpiece 2 so that the other mounting surfaces 23 (first surface 23a and second surface 23b) of workpiece 2 face in the direction to be worked (upward). In addition, mounting head 54 provided in mounter 12B is the second mounting head for mounting components PT on the other mounting surfaces 23 (first surface 23a and second surface 23b) of workpiece 2 positioned by work stage 51 (second positioning mechanism) provided in mounter 12B. Here, the second mounting head is an example of the second working head according to the disclosure.

In the component mounting (component mounting method) in which component PT is mounted on workpiece 2 having a three-dimensional shape by component mounted body manufacturing system 1 according to the first exemplary embodiment having such a configuration, workpiece holder 3 holding workpiece 2 is rocked around lateral rocking axis YJ so as to position workpiece 2 so that one mounting surfaces 23 (third surface 23c and fourth surface 23d) of workpiece 2 face the predetermined direction to be worked (first positioning step), and components PT are mounted on one mounting surfaces 23 (third surface 23c and fourth surface 23d) of positioned workpiece 2 (first mounting step). The posture of workpiece 2 on which components PT are mounted on one mounting surfaces 23 (third surface 23c and fourth surface 23d) in workpiece holder 3 is changed (posture change step), workpiece holder 3 is rocked around rocking axis YJ so as to position workpiece 2 so that the other mounting surfaces 23 (first surface 23a and second surface 23b) of workpiece 2 face the direction to be worked (second positioning step), and components PT are mounted on the other mounting surfaces 23 (first surface 23a and second surface 23b) of positioned workpiece 2 (second mounting step).

In component mounted body manufacturing system 1 in the first exemplary embodiment, by working stage 51 of mounter 12A serving as the first positioning mechanism, work stage 51 of mounter 12B serving as the second positioning mechanism, and posture changing head 81 serving as the posture change mechanism, each of the plurality of mounting surfaces 23 of workpiece holder 3 holding workpiece 2 can mount component PT facing in the predetermined direction to be worked.

Second Exemplary Embodiment

Figure 18:
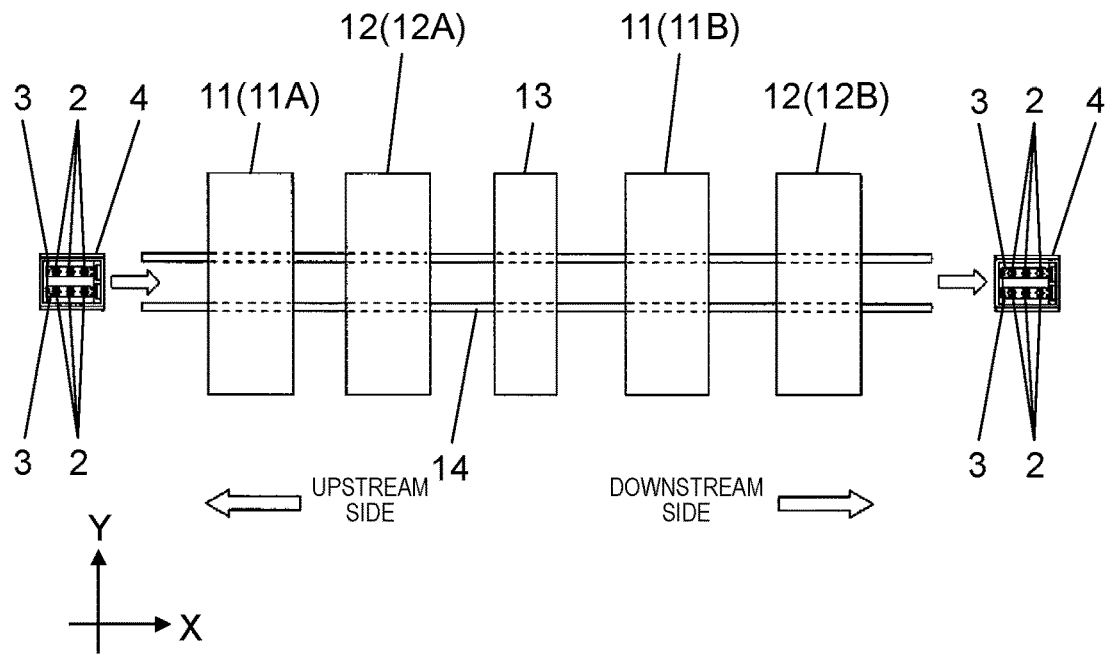
FIG. 18 is a plan view illustrating a schematic configuration of a component mounted body manufacturing system according to a second exemplary embodiment of the disclosure.

Next, a second exemplary embodiment of the disclosure will be described. FIG. 18 illustrates component mounted body manufacturing system 102 according to the second exemplary embodiment. Component mounted body manufacturing system 102 in the second exemplary embodiment is provided with applicator 11A, mounter 12A, applicator 11B, and mounter 12B in order from the upstream side. Posture changer 13 is provided between applicator 11B and mounter 12A. Similarly to the case of the first exemplary embodiment, each device is connected by transport path 14.

In component mounted body manufacturing system 102 in the second exemplary embodiment, applicator 11A applies the viscous body to one mounting surfaces 23 (first surface 23a and second surface 23b) of each workpiece 2. Mounter 12A receives workpiece holder 3 from applicator 11A and mounts components PT on one mounting surfaces 23 (first surface 23a and second surface 23b) of each workpiece 2. Posture changer 13 receives workpiece holder 3 from mounter 12A and changes the posture of each workpiece 2 with respect to workpiece holder 3 from "first posture" to "second posture". Applicator 11B receives workpiece holder 3 from posture changer 13 and applies the viscous body to the other mounting surfaces 23 (third surface 23c and fourth surface 23d) of each workpiece 2. Mounter 12B receives workpiece holder 3 from applicator 11B and mounts components PT on the other mounting surfaces 23 (third surface 23c and fourth surface 23d) of each workpiece 2.

As described above, in component mounted body manufacturing system 102 in the second exemplary embodiment, work stage 51 provided in mounter 12A is the first positioning mechanism for rocking workpiece holder 3 holding workpiece 2 around lateral rocking axis YJ, and positioning workpiece 2 so that one mounting surfaces 23 (first surface 23a and second surface 23b) of workpiece 2 face the predetermined direction to be worked. In addition, mounting head 54 provided in mounter 12A is the first mounting head for mounting components PT on one mounting surfaces 23 (first surface 23a and second surface 23b) of workpiece 2 positioned by working stage 51 (first positioning mechanism) provided in mounter 12A.

In addition, in component mounted body manufacturing system 102 in the second exemplary embodiment, the transport mechanism for transporting carrier 4 along transport path 14 is the transport mechanism for transporting workpiece holder 3 holding workpiece 2 to the downstream side. In addition, posture changing head 81 provided in posture changer 13 is the posture change mechanism for changing the posture of workpiece 2 on which components PT is mounted on one mounting surfaces 23 (first surface 23a and second surface 23b) in workpiece holder 3 by mounting head 54 (first mounting head) provided in mounter 12A.

In addition, in component mounted body manufacturing system 102 in the second exemplary embodiment, work stage 51 provided in mounter 12B is the second positioning mechanism for rocking workpiece holder 3 in which the posture of workpiece 2 is changed by posture changing head 81 (posture change mechanism) provided in posture changer 13 around lateral rocking axis YJ so as to position workpiece 2 so that the other mounting surfaces 23 (third surface 23c and fourth surface 23d) of workpiece 2 face in the direction to be worked. In addition, mounting head 54 provided in mounter 12B is the second mounting head for mounting components PT on the other mounting surfaces 23 (third surface 23c and fourth surface 23d) of workpiece 2 positioned by work stage 51 (second positioning mechanism) provided in mounter 12B.

In the component mounting method in which component PT is mounted on workpiece 2 having a three-dimensional shape by component mounted body manufacturing system 102 according to the second exemplary embodiment having such a configuration, workpiece holder 3 holding workpiece 2 is rocked around lateral rocking axis YJ so as to position workpiece 2 so that one mounting surfaces 23 (first surface 23a and second surface 23b) of workpiece 2 face the predetermined direction to be worked (first positioning step), and components PT are mounted on one mounting surfaces 23 (first surface 23a and second surface 23b) of workpiece 2 (first mounting step). The posture of workpiece 2 on which components PT are mounted on one mounting surfaces 23 (first surface 23a and second surface 23b) in workpiece holder 3 is changed (posture change step), workpiece holder 3 is rocked around lateral rocking axis YJ so as to position workpiece 2 so that the other mounting surfaces 23 (third surface 23c and fourth surface 23d) of workpiece 2 face the direction to be worked (second positioning step), and component PT are mounted on the other mounting surfaces 23 (third surface 23c and fourth surface 23d) of workpiece 2 positioned in the second positioning step (second mounting step).

As described above, even in component mounted body manufacturing system 102 in the second exemplary embodiment, similarly to the case of the first exemplary embodiment, by working stage 51 of mounter 12A serving as the first positioning mechanism, work stage 51 of mounter 12B serving as the second positioning mechanism, and posture changing head 81 serving as the posture change mechanism, each of the plurality of mounting surfaces 23 of workpiece holder 3 holding workpiece 2 can mount component PT facing in the predetermined direction to be worked. In addition, component mounted body manufacturing system 102 in the second exemplary embodiment can reduce the number of posture changers 13 compared to the first exemplary embodiment. As a result, it possible to shorten the total length of component mounted body manufacturing system 102.

Third Exemplary Embodiment

Figure 19:
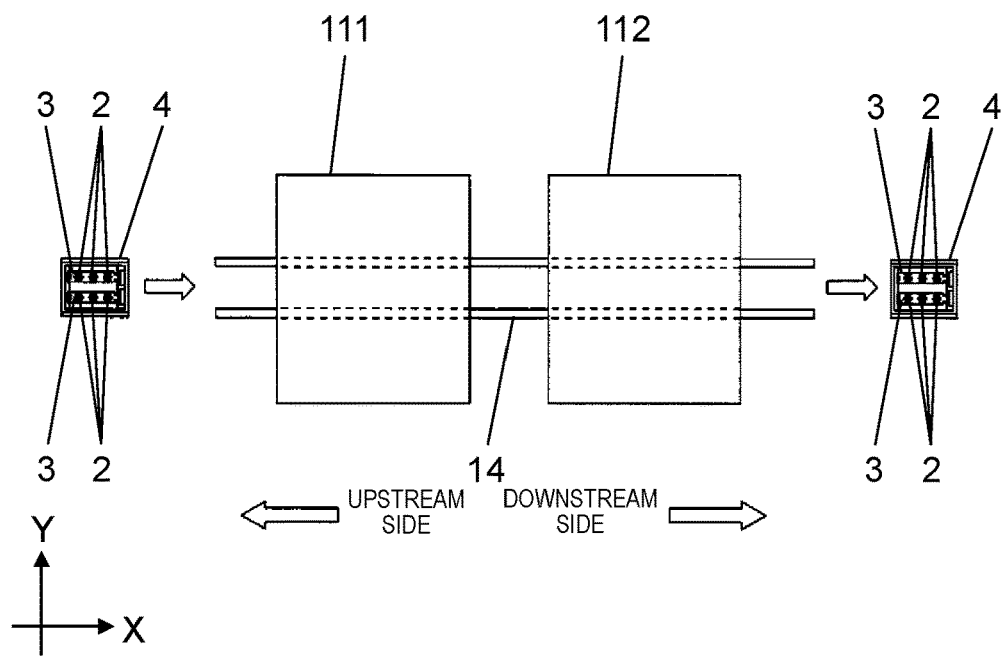
FIG. 19 is a plan view illustrating a schematic configuration of a component mounted body manufacturing system according to a third exemplary embodiment of the disclosure.
Figure 20:
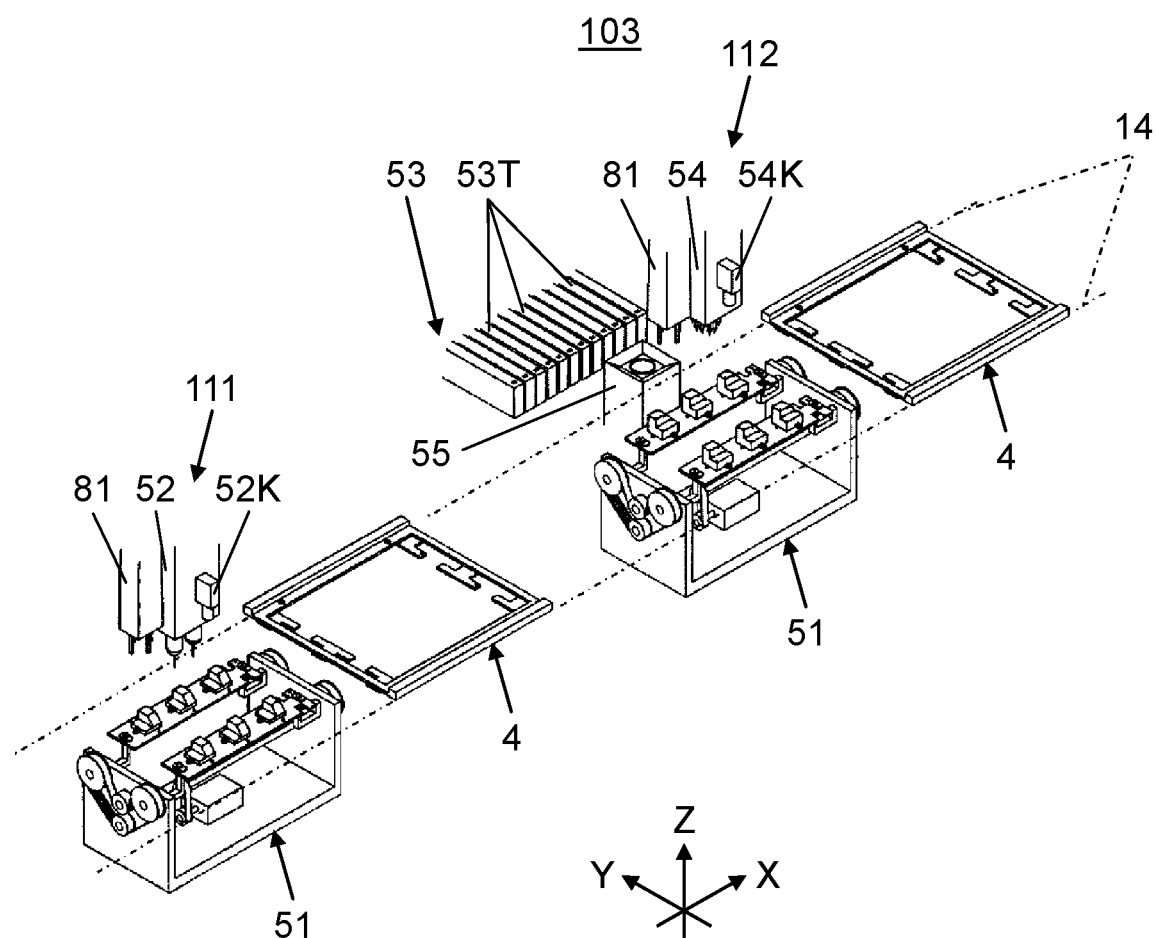
FIG. 20 is a perspective view illustrating a schematic configuration of the component mounted body manufacturing system according to the third exemplary embodiment of the disclosure.

Next, a third exemplary embodiment of the disclosure will be described. FIGS. 19 and 20 illustrate component mounted body manufacturing system 103 according to the third exemplary embodiment of the disclosure. Component mounted body manufacturing system 103 in the third exemplary embodiment is provided with applicator 11A, mounter 12A, applicator 111, and mounter 112 in order from the upstream side. Applicator 111 and mounter 112 are connected by transport path 14 in the same manner as applicator 11 and mounter 12 of the first exemplary embodiment and the second exemplary embodiment.

Figure 21:
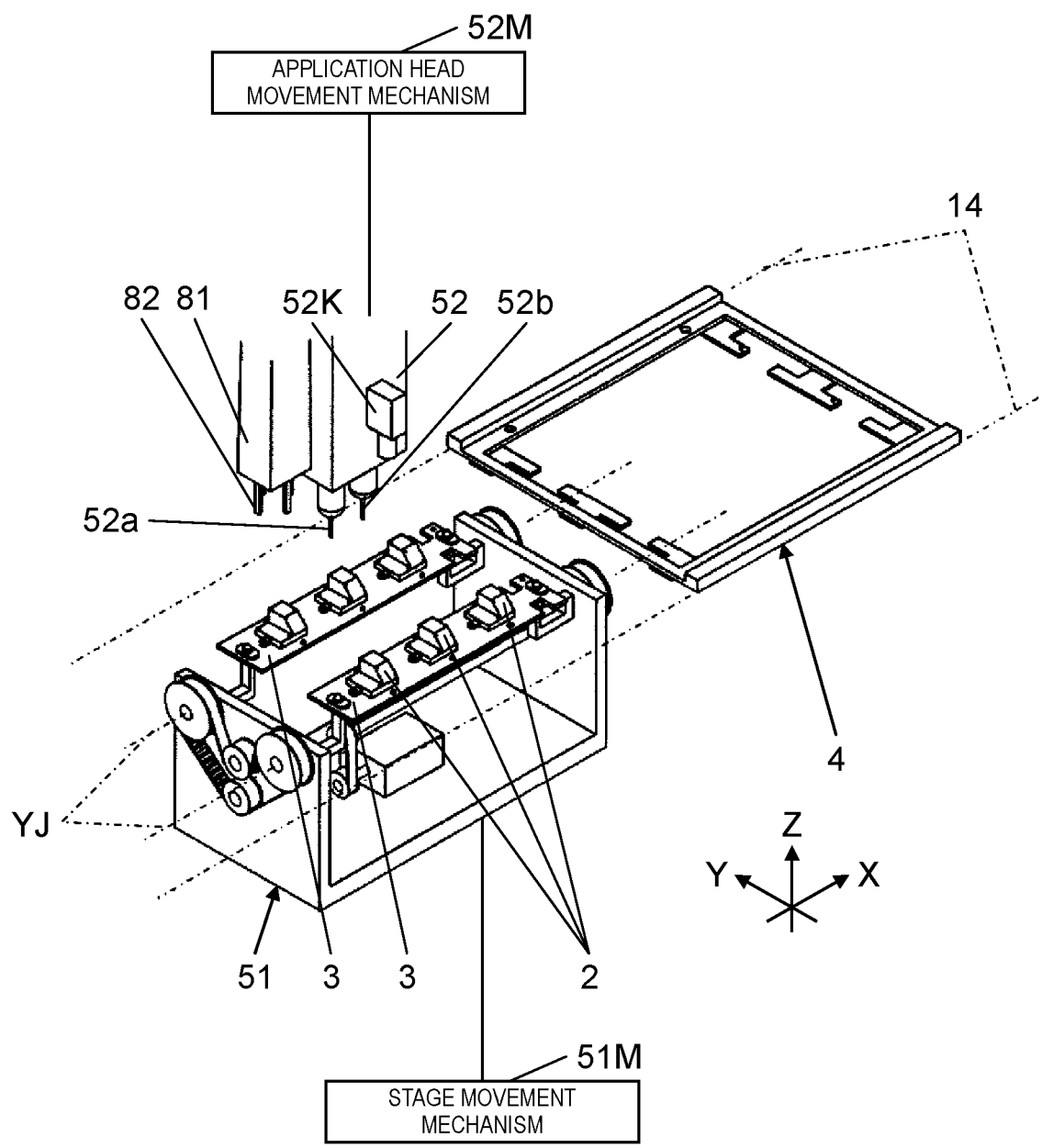
FIG. 21 is a perspective view of a principal part of an applicator provided in the component mounted body manufacturing system according to the third exemplary embodiment of the disclosure.
Figure 22:
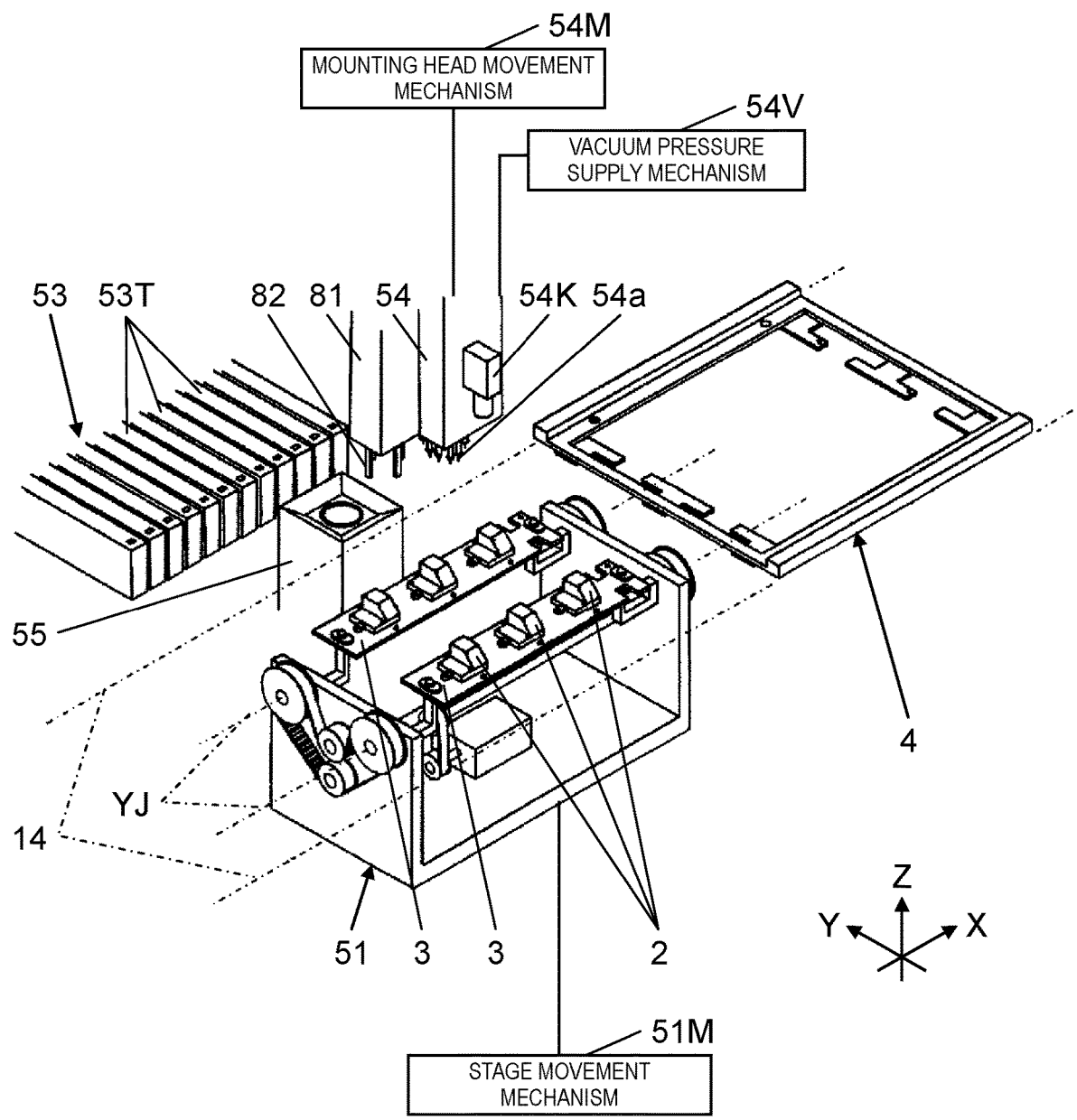
FIG. 22 is a perspective view of a principal part of a mounter provided in the component mounted body manufacturing system according to the third exemplary embodiment of the disclosure.

In component mounted body manufacturing system 103 according to the third exemplary embodiment, applicator 111 has posture changing head 81 in addition to the above configuration. Posture changing head 81 is provided integrally with application head 52 (FIGS. 20 and 21). Mounter 112 also has posture changing head 81 in addition to the above configuration. Posture changing head 81 is provided integrally with mounting head 54 (FIGS. 20 and 22).

In component mounted body manufacturing system 103 according to the third exemplary embodiment, applicator 111 rocks workpiece holder 3 holding workpiece 2 in the "first posture" around rocking axis YJ by work stage 51 as the positioning mechanism, and directs one mounting surfaces 23 (first surface 23a and second surface 23b) in the direction to be worked (upward). The viscous body is applied to one mounting surfaces 23 (first surface 23a and second surface 23b) of each workpiece 2 by application head 52 (first application head). When the viscous body is applied to one mounting surfaces 23 (first surface 23a and second surface 23b) of each workpiece 2, applicator 111 changes the posture of each workpiece 2 with respect to workpiece holder 3 from the "first posture" to the "second posture" by posture changing head 81 provided in application head 52. Workpiece holder 3 holding workpiece 2 whose posture is changed is rocked around rocking axis YJ by work stage 51 as the positioning mechanism, and the viscous body is applied to the other mounting surfaces 23 (third surface 23c and fourth surface 23d) by application head 52 (second application head). Here, the first application head is an example of the first working head according to the disclosure. The second application head is an example of the second working head according to the disclosure.

When the viscous body is applied to the other mounting surfaces 23 (third surface 23c and fourth surface 23d) of each workpiece 2, applicator 111 transports carrier 4 on which workpiece holder 3 is placed to mounter 112 on the downstream side. Mounter 112 receives carrier 4 from applicator 111, rocks workpiece holder 3 holding workpiece 2 in the "second posture" around rocking axis YJ by work stage 51 as the positioning mechanism, and directs the other mounting surfaces 23 (third surface 23c and fourth surface 23d) in the direction to be worked (upward). Component PT are mounted on the other mounting surfaces 23 (third surface 23c and fourth surface 23d) of each workpiece 2 by mounting head 54. When components PT are mounted on the other mounting surfaces 23 (third surface 23c and fourth surface 23d) of each workpiece 2, mounter 112 changes the posture of each workpiece 2 with respect to workpiece holder 3 from the "second posture" to the "first posture" by posture changing head 81 provided in mounting head 54. Workpiece holder 3 holding workpiece 2 whose posture is changed is rocked around rocking axis YJ by work stage 51 as the positioning mechanism, and components PT are mounted on one mounting surfaces 23 (first surface 23a and second surface 23b) by mounting head 54.

As described above, in component mounted body manufacturing system 103 according to the third exemplary embodiment, work stage 51 provided in mounter 112 is the positioning mechanism for rocking workpiece holder 3 holding workpiece 2 around lateral rocking axis YJ, and positioning workpiece 2 so that one mounting surface 23 of workpiece 2 faces the predetermined direction to be worked.

In addition, in component mounted body manufacturing system 103 according to the third exemplary embodiment, the transport mechanism for transporting carrier 4 along transport path 14 is the transport mechanism for transporting workpiece holder 3 holding workpiece 2 to the downstream side. In addition, posture changing head 81 provided in mounter 112 is the posture change mechanism for changing the posture of workpiece 2 on which components PT are mounted on one mounting surfaces 23 (third surface 23c and fourth surface 23d) in workpiece holder 3.

In the component mounting method in which component PT is mounted on workpiece 2 having a three-dimensional shape by component mounted body manufacturing system 103 according to the third exemplary embodiment having such a configuration, workpiece holder 3 holding workpiece 2 is rocked around lateral rocking axis YJ so as to position workpiece 2 so that one mounting surfaces 23 (third surface 23c and fourth surface 23d) of workpiece 2 face the predetermined direction to be worked (first positioning step), and components PT are mounted on one mounting surfaces 23 (third surface 23c and fourth surface 23d) of workpiece 2 (first mounting step). The posture of workpiece 2 on which components PT are mounted on one mounting surfaces 23 (third surface 23c and fourth surface 23d) in workpiece holder 3 is changed (posture change step), workpiece holder 3 is rocked around lateral rocking axis YJ so as to position workpiece 2 so that the other mounting surfaces 23 (first surface 23a and second surface 23b) of workpiece 2 face the direction to be worked (second positioning step), and component PT are mounted on the other mounting surfaces 23 (first surface 23a and second surface 23b) of workpiece 2 positioned in the second positioning step (second mounting step). In the third exemplary embodiment, it possible to shorten the total length of component mounted body manufacturing system 103 compared to the first exemplary embodiment and the second exemplary embodiment.

As described above, in component mounted body manufacturing system 1, 102, and 103 in the exemplary embodiment, by rocking workpiece holder 3 holding workpiece 2 having the three-dimensional shape around lateral rocking axis YJ, it is possible to direct each of one mounting surfaces 23 of workpiece 2 in the predetermined direction to be worked, and by changing the posture of workpiece 2 with respect to workpiece holder 3, it is possible to mount component PT on each of the other mounting surfaces 23 of workpiece 2 in the direction to be worked. Therefore, it is possible to mount component PT on workpiece 2 having the three-dimensional shape with a simple configuration. In addition, since component mounted body manufacturing systems 1, 102, and 103 of the disclosure have not complicated configuration as in known documents, the manufacturing cost can be reduced. Provided are the component mounted body manufacturing system and the component mounted body manufacturing method capable of a performing predetermined work such as a mounting work of the component on the workpiece having the three-dimensional shape and an applying work of the viscous body with a simple configuration.

What is claimed is:

1. A component mounted body manufacturing system that manufactures a component mounted body in which a component is mounted on a workpiece having a three-dimensional shape, the system comprising:

a first positioning mechanism that rocks a workpiece holder holding a workpiece around a lateral rocking axis, and positions the workpiece so that one mounting surface of the workpiece faces a predetermined direction to be worked;

a first working head that performs a predetermined work on the one mounting surface of the workpiece positioned by the first positioning mechanism;

a posture change mechanism that changes a posture relative to the workpiece holder of the workpiece in which the predetermined work is performed on the one mounting surface;

a second positioning mechanism that rocks, around the lateral rocking axis, the workpiece holder in which the posture of the workpiece is changed by the posture change mechanism, and positions the workpiece so that another mounting surface of the workpiece faces the predetermined direction to be worked;

a second working head that performs a predetermined work on the another mounting surface of the workpiece positioned by the second positioning mechanism; and a transport mechanism that transports the workpiece holder from the first positioning mechanism to the second positioning mechanism, wherein the posture change mechanism detaches the workpiece from the workpiece holder, rotates the workpiece, and reattaches the rotated workpiece to the workpiece holder.

2. The component mounted body manufacturing system of claim 1,
wherein the posture change mechanism is provided in at least one of the first working head or the second working head.

3. The component mounted body manufacturing system of claim 1,
wherein the posture change mechanism is disposed between the first positioning mechanism and the second positioning mechanism and in a transport path of the workpiece holder transported by the transport mechanism.

4. The component mounted body manufacturing system of claim 1,
wherein the workpiece holder holds a plurality of the workpieces arranged in a row on the workpiece holder, and the rocking axes of the first positioning mechanism and the second positioning mechanism extend in a same direction as an arrangement direction of the plurality of the workpieces.

5. The component mounted body manufacturing system of claim 1,
wherein the transport mechanism places the workpiece holder on a carrier to transport the workpiece holder.

6. The component mounted body manufacturing system of claim 1,
wherein the first working head is a first mounting head that mounts a component on the one mounting surface of the workpiece, and the second working head is a second mounting head that mounts a component on the another mounting surface of the workpiece.

7. The component mounted body manufacturing system of claim 1,
wherein the first working head is a first application head that applies a viscous body to the one mounting surface of the workpiece, and the second working head is a second application head that applies a viscous body to the another mounting surface of the workpiece.

8. The component mounted body manufacturing system of claim 1, wherein the posture change mechanism rotates the detached workpiece about an axis extending orthogonally relative to the lateral rocking axis.

9. The component mounted body manufacturing system of claim 1, wherein the posture change mechanism reattaches the workpiece in a secondary posture relative to the workpiece holder that is rotated from a primary posture relative to the workpiece holder of the workpiece prior to being detached.

10. A component mounted body manufacturing system that mounts a component on a workpiece having a three-dimensional shape, the system comprising:
a positioning mechanism that rocks, around a lateral rocking axis, a workpiece holder holding the workpiece and positions the workpiece so that a mounting surface of the workpiece faces a predetermined direction to be worked;

a posture change mechanism that changes a posture of the workpiece in the workpiece holder; and a working head that performs a predetermined work on a mounting surface positioned by the positioning mechanism to face the direction to be worked, wherein the posture change mechanism detaches the workpiece from the workpiece holder, rotates the workpiece, and reattaches the rotated workpiece to the workpiece holder.

11. The component mounted body manufacturing system of claim 10,
wherein the posture change mechanism is provided in the working head.

12. The component mounted body manufacturing system of claim 10,
wherein the workpiece holder holds a plurality of the workpieces arranged in a row on the workpiece holder, and the rocking axis of the positioning mechanism extends in a same direction as an arrangement direction of the plurality of the workpieces.

13. The component mounted body manufacturing system of claim 10,
wherein the working head is a mounting head that mounts a component on the mounting surface of the workpiece.

14. The component mounted body manufacturing system of claim 10,
wherein the working head is an application head that applies a viscous body to the mounting surface of the workpiece.

15. A component mounting method for mounting a component on a workpiece having a three-dimensional shape, the method comprising:
a first positioning step of positioning the workpiece so that one mounting surface of the workpiece faces a predetermined direction to be worked by rocking, around a lateral rocking axis, a workpiece holder holding the workpiece;

a first work step of performing a predetermined work on the one mounting surface of the workpiece positioned in the first positioning step;

a posture change step of changing a posture relative to the workpiece holder of the workpiece on which the first work step is finished;

a second positioning step of positioning the workpiece so that another mounting surface of the workpiece faces the predetermined direction to be worked by rocking, around the lateral rocking axis, the workpiece holder in which the posture of the workpiece is changed in the posture change step; and a second work step of performing a predetermined work on the another mounting surface of the workpiece positioned in the second positioning step, wherein the posture change step is performed in a procedure of detaching the workpiece from the workpiece holder, rotating the workpiece, and reattaching the rotated workpiece to the workpiece holder.

16. The component mounting method of claim 15,
wherein the workpiece holder holds a plurality of the workpieces in a state of being arranged in a direction where the rocking axis extends.

17. The component mounting method of claim 15,
wherein the predetermined work is a work of mounting the component on the mounting surface.

18. The component mounting method of claim 15,
wherein the predetermined work is a work of applying a viscous body to the mounting surface.

19. The component mounting method of claim 15, wherein the rotating the detached workpiece is performed about an axis extending orthogonally relative to the lateral rocking axis.

20. The component mounting method of claim 15, wherein the reattaching the rotated workpiece includes reattaching the workpiece in a secondary posture relative to the workpiece holder that is rotated from a primary posture relative to the workpiece holder of the workpiece prior to the detaching the workpiece.

* * * * *